US012787738B2

(12) United States Patent
Lee et al.

(10) Patent No.: US 12,787,738 B2
(45) Date of Patent: Nov. 3, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Sangsoo Lee, Seongnam-si (KR); Hyungjoon Kim, Yongin-si (KR); Eunhyun Kim, Hwaseong-si (KR); Hyunggon Shin, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 623 days.

(21) Appl. No.: 17/959,780

(22) Filed: Oct. 4, 2022

(65) Prior Publication Data

US 2023/0223345 A1 Jul. 13, 2023

(30) Foreign Application Priority Data

Jan. 11, 2022 (KR) ........................ 10-2022-0004188

(51) Int. Cl.
*H10W 20/20* (2026.01)
*H10B 41/27* (2023.01)
(Continued)

(52) U.S. Cl.
CPC ............ *H10W 20/20* (2026.01); *H10B 41/27* (2023.02); *H10B 41/41* (2023.02); *H10B 43/27* (2023.02); *H10B 43/40* (2023.02)

(58) Field of Classification Search
CPC ................................ H10B 80/00; H05K 1/112
See application file for complete search history.

(56) References Cited

U.S. PATENT DOCUMENTS 7,622,778 B2 * 11/2009 Lee .................. H10W 10/0145 257/E21.549
10,192,929 B2 1/2019 Mori
(Continued)

FOREIGN PATENT DOCUMENTS

KR 10-2016-0069903 A 6/2016
KR 10-2019-0085475 A 7/2019
(Continued)

OTHER PUBLICATIONS

Korean Office Action dated Nov. 11, 2025 issued in Korean Patent Application No. 10-2022-0004188.
(Continued)

*Primary Examiner* — Marlon T Fletcher
*Assistant Examiner* — Kimberly Newman Frey
(74) *Attorney, Agent, or Firm* — HARNESS, DICKEY & PIERCE, P.L.C.

(57) ABSTRACT

A semiconductor device includes a first semiconductor structure, and a second semiconductor structure on the first semiconductor structure. The second semiconductor structure includes a substrate having first and second regions, gate electrodes spaced apart from each other on the first region, extending by different lengths and including a pad region having an upper surface exposed upwardly, interlayer insulating layers alternately stacked with the gate electrodes, channel structures penetrating through the gate electrodes, gate contact plugs penetrating through the pad region of each of the gate electrodes and extending into the first semiconductor structure, and an insulating structure alternating with the interlayer insulating layers below each of the pad regions and surrounding the gate contact plugs. The insulating structure includes a first insulating layer and a second insulating layer surrounding at least a portion of the
(Continued)

first insulating layer and including a material different from any of the first insulating layer.

18 Claims, 22 Drawing Sheets

(51) Int. Cl.

| | |
|---|---|
| ***H10B 41/41*** | (2023.01) |
| ***H10B 43/27*** | (2023.01) |
| ***H10B 43/40*** | (2023.01) |

(56) References Cited

U.S. PATENT DOCUMENTS

| | | | | |
|---|---|---|---|---|
| 10,304,852 | B1 | 5/2019 | Cui et al. | |
| 10,748,923 | B2 | 8/2020 | Son et al. | |
| 10,910,396 | B2 * | 2/2021 | Kim | H01L 23/5226 |
| 2019/0051665 | A1 | 2/2019 | Yun et al. | |
| 2020/0105783 | A1 | 4/2020 | Baek | |
| 2020/0350249 | A1 | 11/2020 | Kim et al. | |
| 2021/0098367 | A1 | 4/2021 | Lee | |
| 2021/0193672 | A1 | 6/2021 | Kim et al. | |
| 2021/0287986 | A1 * | 9/2021 | Gwon | H10W 20/42 |
| 2022/0173120 | A1 * | 6/2022 | Lee | H10B 43/10 |
| 2022/0406720 | A1 * | 12/2022 | Hinoue | H10D 64/037 |
| 2023/0069307 | A1 * | 3/2023 | Shimomura | H10B 41/35 |

FOREIGN PATENT DOCUMENTS

| | | | |
|---|---|---|---|
| KR | 10-2021-0005441 | A | 1/2021 |
| KR | 10-2021-0093526 | A | 7/2021 |

OTHER PUBLICATIONS

Korean Notice of Allowance dated Aug. 26, 2026 for corresponding Korean Patent Application No. 10-2022-0004188 and its English-language translation.

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0004188 filed on Jan. 11, 2022 in the Korean Intellectual Property Office, the disclosure of which is incorporated herein by reference in its entirety.

BACKGROUND

Some example embodiments relate to a semiconductor device and/or a data storage system including the same.

A semiconductor device able to store high-capacity data in a data storage system requiring data storage has been necessary. Accordingly, a method for increasing data storage capacity of a semiconductor device has been researched. For example, as a method for increasing data storage capacity of a semiconductor device, a semiconductor device including memory cells arranged three-dimensionally, instead of memory cells arranged two-dimensionally, has been suggested.

SUMMARY

Some example embodiments provide a semiconductor device having improved production yield and/or electrical properties, and/or a data storage system including the same.

According to various example embodiments, a semiconductor device includes a first semiconductor structure including a first substrate and circuit devices on the first substrate, and a second semiconductor structure on the first semiconductor structure. The second semiconductor structure includes a second substrate having a first region and a second region, gate electrodes spaced apart from each other in a first direction on the first region, the gate electrodes extending by different lengths in a second direction on the second region, and respectively including a pad region having an upper surface exposed upwardly on the second region, interlayer insulating layers alternately stacked with the gate electrodes, channel structures penetrating through the gate electrodes, extending in the first direction, and respectively including a channel layer, gate contact plugs penetrating through the pad region of each of the gate electrodes and extending into the first semiconductor structure in the first direction, and an insulating structure alternately with the interlayer insulating layers below each of the pad regions and surrounding the gate contact plugs. The insulating structure further includes a first insulating layer and a second insulating layer surrounding at least a portion of the first insulating layer and including a material different from any material of the first insulating layer, and the second insulating layer includes a first portion filling a region between the first insulating layer and each of the gate electrodes opposing the first insulating layer and extending onto upper and lower surfaces of the first insulating layer.

According to some example embodiments, a semiconductor device includes a substrate having a first region and a second region, gate electrodes stacked and spaced apart from each other in a first direction on the first region, extending by different lengths in a second direction on the second region, and respectively including a pad region having an upper surface exposed upwardly and a remaining stack region on the second region, a gate contact plug penetrating through the pad region of a first gate electrode, which is one of the gate electrodes, the gate contact plug electrically connected to the first gate electrode, penetrating through the stack region of a second gate electrode, which is another one of the gate electrodes and the gate contact plug below the first gate electrode and spaced apart from the second gate electrode, and an insulating structure disposed between the gate contact plug and the second gate electrode. The insulating structure includes a first insulating layer and a second insulating layer including a material different from a material of the first insulating layer and surrounding the first insulating layer.

According to some example embodiments, a data storage system includes a first semiconductor structure including a first substrate and circuit devices on the first substrate, and a second semiconductor structure on the first semiconductor structure. The second semiconductor structure includes a second substrate having a first region and a second region, gate electrodes stacked and spaced apart from each other in a first direction on the first region, extending by different lengths in a second direction on the second region, and respectively including a pad region having an upper surface exposed upwardly on the second region, interlayer insulating layers alternately stacked with the gate electrodes, channel structures penetrating through the gate electrodes, extending in the first direction, and respectively including a channel layer, gate contact plugs penetrating through the pad region of each of the gate electrodes and extending into the first semiconductor structure in the first direction, an insulating structure alternately arranged with the interlayer insulating layers below each of the pad regions and surrounding the gate contact plugs, a semiconductor storage device including input/output pads electrically connected to the circuit devices, and a controller electrically connected to the semiconductor storage device through the input/output pad and configured to control the semiconductor storage device. The insulating structure further includes a first insulating layer and a second insulating layer surrounding at least a portion of the first insulating layer and including a material different from a material of the first insulating layer. The second insulating layer includes a first portion filling a region between the first insulating layer and each of the gate electrodes opposing the first insulating layer and extending onto upper and lower surfaces of the first insulating layer.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
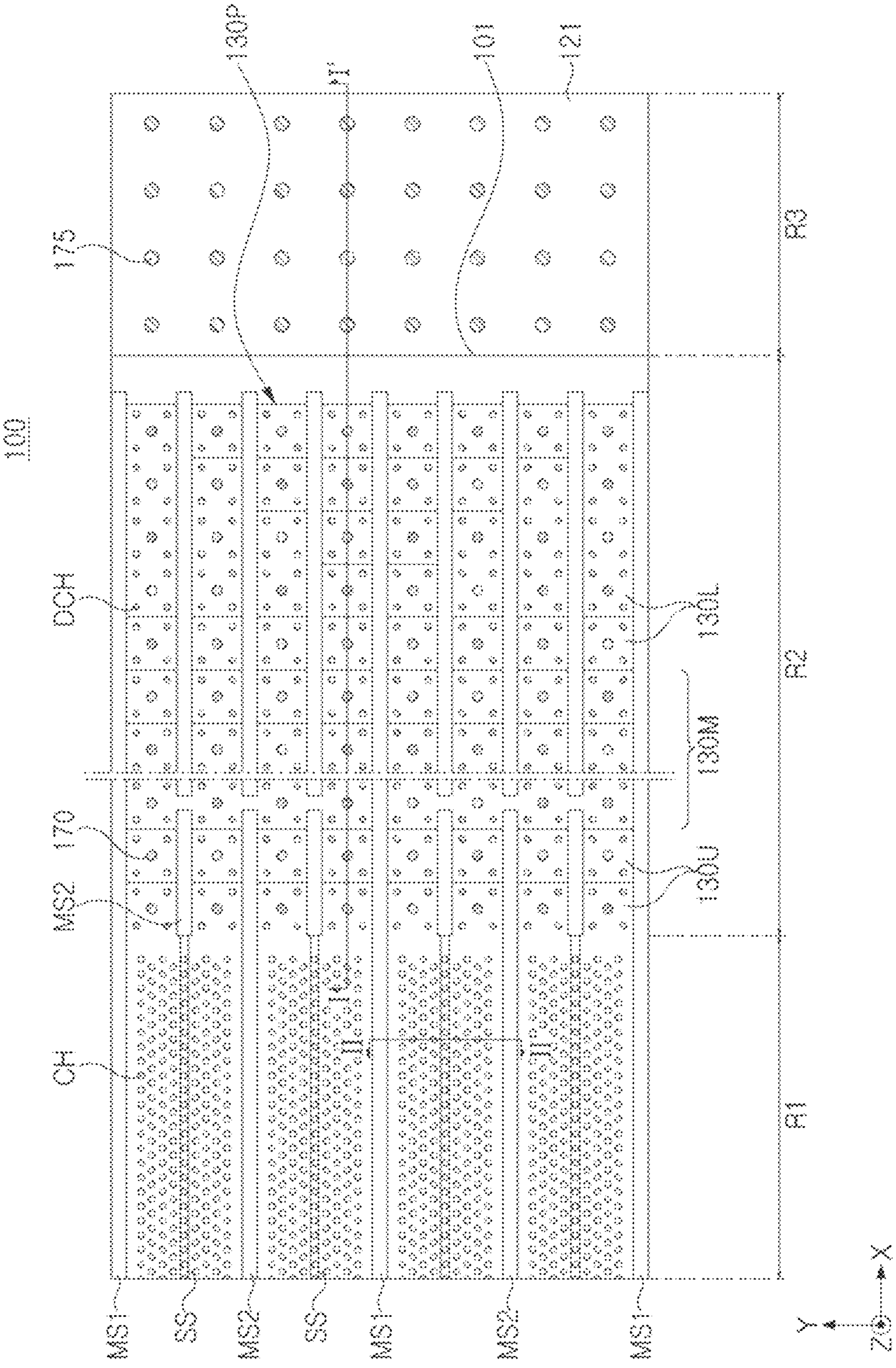
FIG. 1 is a plan diagram illustrating a semiconductor device according to various example embodiments.

FIG. 1 is a plan diagram illustrating a semiconductor device according to various example embodiments.

Figure 2A:
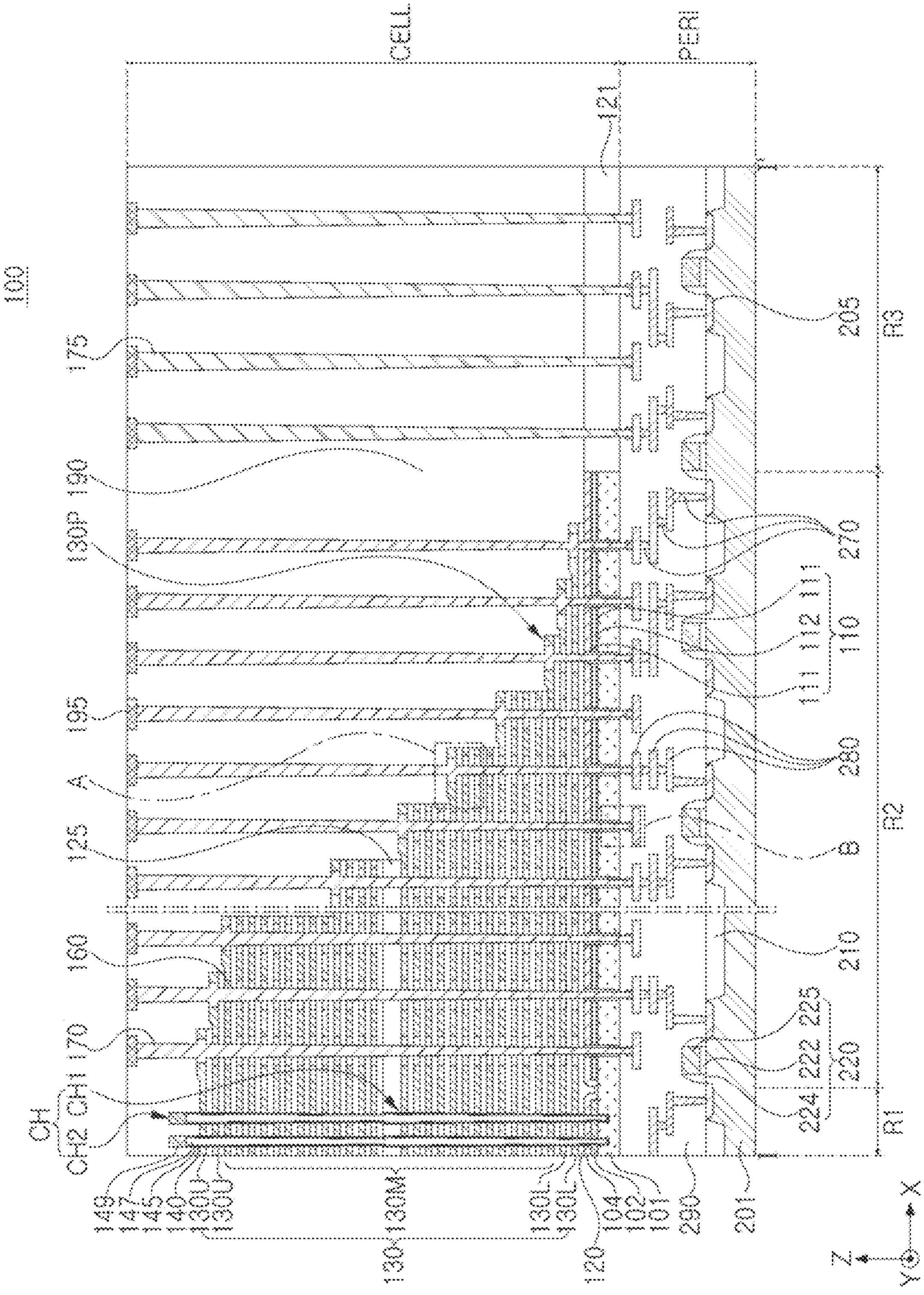
FIGS. 2A and 2B are cross-sectional diagrams illustrating a semiconductor device according to various example embodiments.
Figure 2B:
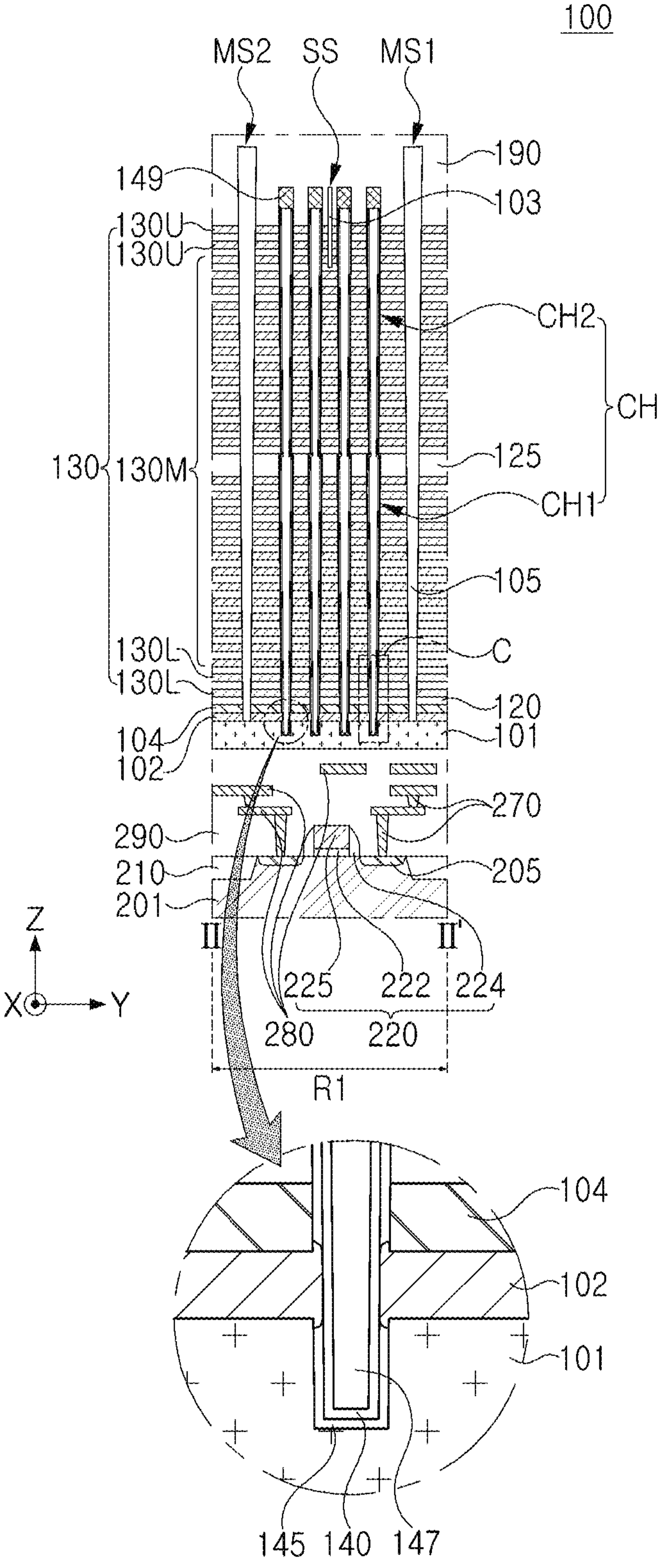

FIGS. 2A and 2B are cross-sectional diagrams illustrating a semiconductor device 100 according to various example embodiments. FIG. 2A is a cross-sectional diagram taken along line I-I' in FIG. 1, and FIG. 2B is a cross-sectional diagram taken along line II-II' in FIG. 1.

Figure 3A:
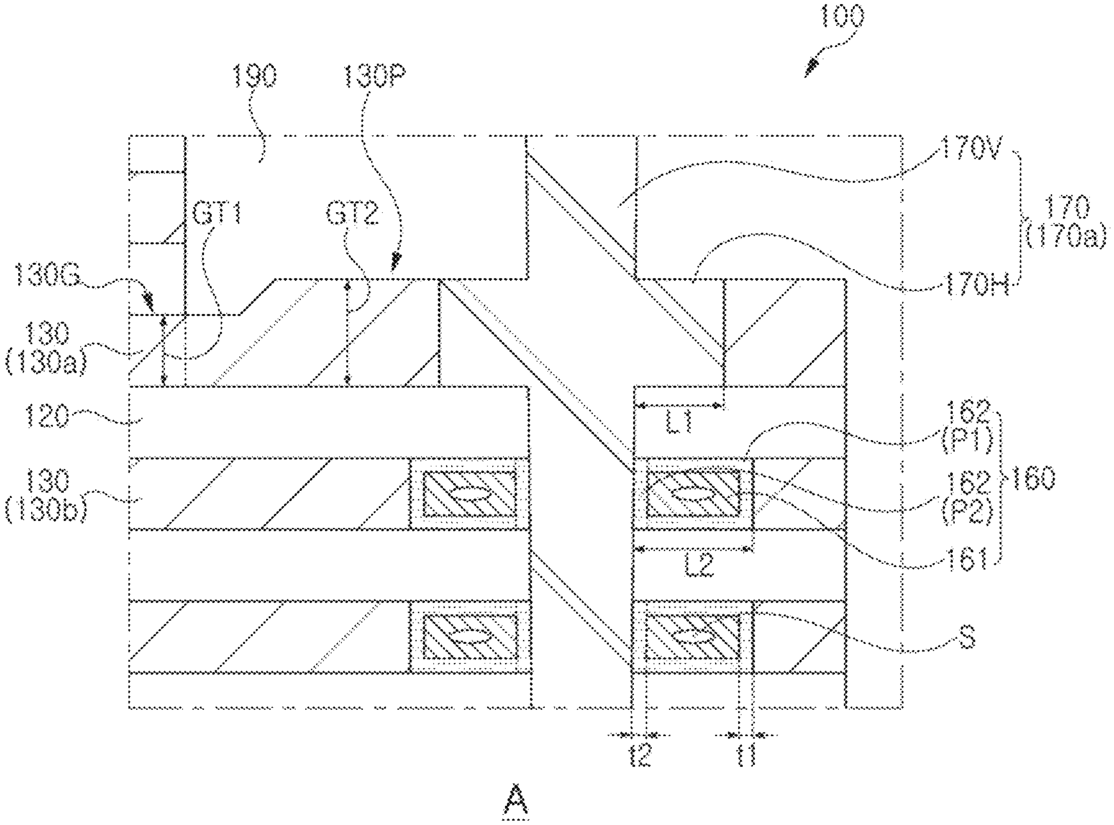
FIGS. 3A and 3B are enlarged diagrams illustrating a portion of a semiconductor device according to various example embodiments.
Figure 3B:
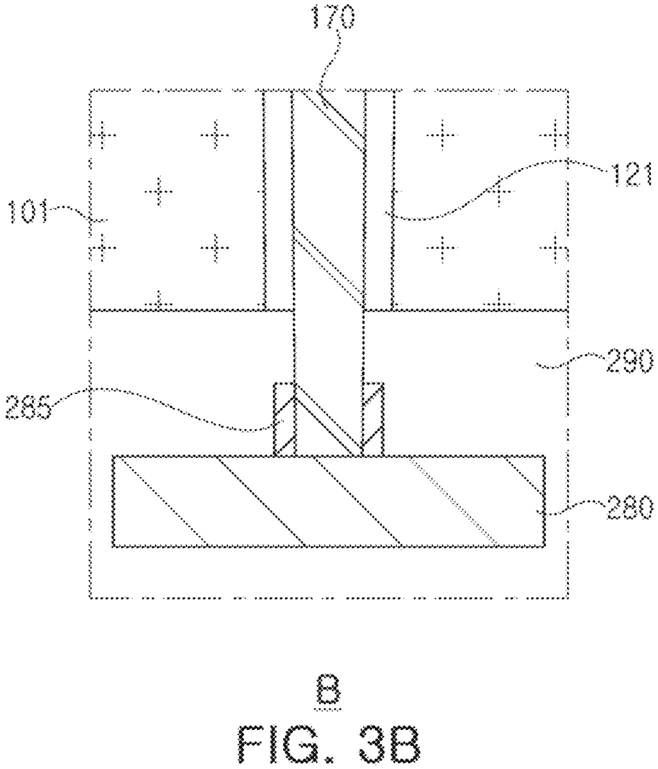

FIGS. 3A and 3B are enlarged diagrams illustrating a portion of a semiconductor device according to various example embodiments. FIG. 3A is an enlarged diagram illustrating region "A" in FIG. 2A, and FIG. 3B is an enlarged diagram illustrating region "B".

Referring to FIGS. 1 to 3B, the semiconductor device 100 may include a peripheral circuit region PERI which may be or may include a first semiconductor structure including a first substrate 201, and a memory cell region CELL which may be or may include a second semiconductor structure including a second substrate 101. The memory cell region CELL may be disposed on the peripheral circuit region PERI. Alternatively, in some example embodiments, the memory cell region CELL may be disposed below the peripheral circuit region PERI.

The peripheral circuit region PERI may include the first substrate 201, source/drain regions 205 and device isolation layers 210 in the first substrate 201, circuit devices 220 disposed on the first substrate 201, circuit contact plugs 270, circuit wiring lines 280, and a peripheral region insulating layer 290.

The first substrate 201 may have an upper surface extending in the X-direction and the Y-direction. An active region may be defined in the first substrate 201 by the device isolation layers 210. The source/drain regions 205 including impurities may be disposed in a portion of the active region. The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

The circuit devices 220 may include a planar transistor; however, example embodiments are not limited thereto, and the circuit devices 220 may include planar transistors and/or three-dimensional transistors. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit devices 220 on the first substrate 201. The circuit contact plugs 270 may penetrate through the peripheral region insulating layer 290 and may be connected to the source/drain regions 205. Electrical signals may be applied to the circuit devices 220 by the circuit contact plugs 270. In a region not illustrated, the circuit contact plugs 270 may also be connected to the circuit gate electrode 225. The circuit wiring lines 280 may be connected to the circuit contact plugs 270 and may be disposed in a plurality of layers.

The memory cell region CELL may include a second substrate 101 having a first region R1 and a second region R2, gate electrodes 130 stacked on the second substrate 101, interlayer insulating layers 120 alternately stacked with the gate electrodes 130, channel structures CH penetrating through a stack structure of the gate electrodes 130 and interlayer insulating layers 120, first and second isolation regions MS1 and MS2 extending by penetrating through the stack structure of the gate electrodes 130, gate contact plugs 170 extending by penetrating through the gate electrodes 130 on the second region R2, and through plugs 175 disposed on the third region R3 externally of the second substrate 101.

The memory cell region CELL may further include an insulating structure 160 surrounding the gate contact plugs 170.

The memory cell region CELL may include a first horizontal conductive layer 102 disposed on the first region R1, a horizontal insulating layer 110 disposed in parallel to the first horizontal conductive layer 102 on the second region R2 of the second substrate 101, the second horizontal conductive layer 104 disposed on the first horizontal conductive layer 102 and the horizontal insulating layer 110, a substrate insulating layer 121 penetrating through the second substrate 101, upper isolation regions SS penetrating through a portion of the stack structure of the gate electrodes 130, dummy channel structures DCH penetrating through the stack structure of the gate electrodes 130 on the second region R2, a cell region insulating layer 190, and cell wiring lines 195.

On the first region R1 of the second substrate 101, the gate electrodes 130 may be vertically stacked and the channel structures CH may be disposed. For example, the first region R1 may be or may include a region which memory cells are disposed. On the second region R2, the gate electrodes 130 may extend (e.g. extend vertically) by different lengths, and the second region R2 may be a region to electrically connect the memory cells to the peripheral circuit region PERI. The second region R2 may be disposed on at least one end of the first region R1 in at least one direction, for example, the X-direction.

The second substrate 101 may have an upper surface extending in the X-direction and the Y-direction. The second substrate 101 may include a semiconductor material, such as, for example, a group IV semiconductor, a group III-V compound semiconductor, or a group II-VI compound semiconductor that may be the same as or different from that of the first substrate 201. For example, the group IV semiconductor may include silicon, germanium, or silicon-germanium. The second substrate 101 may further include impurities. The second substrate 101 may be provided as a polycrystalline semiconductor layer such as a polysilicon layer and/or an epitaxial layer.

The first and second horizontal conductive layers 102 and 104 may be stacked in sequence on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line of the semiconductor device 100, and may work as, for example, a common source line together with the second substrate 101. As illustrated in the enlarged diagram in FIG. 2B, the first horizontal conductive layer 102 may be directly connected to the channel layer 140 around the channel layer 140.

The second horizontal conductive layer 104 may be in contact with the second substrate 101 in a portion of regions in which the first horizontal conductive layer 102 and the horizontal insulating layer 110 are not disposed. The second horizontal conductive layer 104 may cover an end of the first horizontal conductive layer 102 and/or the horizontal insulating layer 110 in the portion of regions and may be bent to extend to the second substrate 101.

The first and second horizontal conductive layers 102 and 104 may include a semiconductor material, and for example, both the first and second horizontal conductive layers 102 and 104 may include polycrystalline silicon such as doped polysilicon. In this case, at least the first horizontal conductive layer 102 may be a doped layer, and the second horizontal conductive layer 104 may be a doped layer and/or may include impurities diffused from the first horizontal conductive layer 102. However, in some example embodiments, the second horizontal conductive layer 104 may be replaced with an insulating layer.

The horizontal insulating layer 110 may be disposed on the second substrate 101 in parallel to the first horizontal conductive layer 102 on at least a portion of the second region R2. The horizontal insulating layer 110 may include first and second horizontal insulating layers 111 and 112 alternately stacked on the second region R2 of the second substrate 101. In various example embodiments, a plurality of the first horizontal insulating layers 111 may be provided and may cover upper and lower surfaces of the second horizontal insulating layer 112. The horizontal insulating layer 110 may be other layers after a portion of the horizontal insulating layers 110 are placed with the first horizontal conductive layer 102 in the process of manufacturing the semiconductor device 100.

The horizontal insulating layer 110 may include one or more of silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as a material of the interlayer insulating layers 120, and the second horizontal insulating layer 112 may be formed of a material different from a material of the interlayer insulating layers 120.

The substrate insulating layer 121 may extend in the Z-direction in the second region R2 and may penetrate the second substrate 101, the horizontal insulating layer 110, and the second horizontal conductive layer 104. The substrate insulating layer 121 may be disposed to surround each of the gate contact plugs 170. Accordingly, the gate contact plugs 170 connected to different gate electrodes 130 may be electrically isolated from each other. Alternatively or additionally, the substrate insulating layer 121 may also be disposed on third region R3, which is external side of the second substrate 101. The substrate insulating layer 121 may include, for example, one or more of silicon oxide, silicon nitride, silicon carbide, or silicon oxynitride.

The gate electrodes 130 may be vertically stacked and spaced apart from each other on the second substrate 101 and may form a stack structure. The gate electrodes 130 may include lower gate electrodes 130L forming a gate of the ground select transistor, memory gate electrodes 130M forming a plurality of memory cells, and upper gate electrodes 130U forming gates of the string select transistors. The number of memory gate electrodes 130M included in memory cells may be determined according to a capacity of the semiconductor device 100. In some example embodiments, the number of each of upper and lower gate electrodes 130U and 130L may be the same as each other or different from each other, and may be 1 to 4 or more, and may have a structure the same as or different from the memory gate electrodes 130M. In some example embodiments, the gate electrodes 130 may further include a gate electrode 130 disposed on the upper gate electrodes 130U and/or below the lower gate electrode 130L and included in an erase transistor used for an erase operation using, for example, a gate induced drain leakage (GIDL) phenomenon. Also, a portion of the gate electrodes 130, such as, for example, the memory gate electrodes 130M adjacent to the upper or lower gate electrodes 130U and 130L may be dummy gate electrodes.

The gate electrodes 130 may be vertically stacked and spaced apart from each other on the first region R1, may extend from the first region R1 to the second region R2 by different lengths and may form a stepped structure in a staircase form. As illustrated in FIG. 2A, the gate electrodes 130 may form a stepped structure or a staircase structure between the gate electrodes 130 in the X-direction, and may be disposed to have a stepped structure in the Y-direction as well.

Due to the stepped structure, in the gate electrodes 130, the lower gate electrode 130 may extend longer than the upper gate electrode 130, such that the gate electrodes 130 may have regions exposed upwardly from the interlayer insulating layers 120, respectively, and the regions may be referred to as pad regions 130P. In each gate electrode 130, the pad region 130P may include an end in the X-direction. The pad region 130P may correspond to a portion of the gate electrode 130 disposed in an uppermost portion of each region among the gate electrodes 130 on the second region R2 of the second substrate 101. The gate electrodes 130 may be connected to the gate contact plugs 170 in the pad regions 130P. The regions other than the pad region 130P in each of the gate electrodes 130 may be referred to as a stack region 130G. The stack region 130G may be or may correspond to a portion not exposed upwardly from the interlayer insulating layers 120.

The gate electrodes 130 may have an increased thickness in the pad regions 130P. The thickness of each of the gate electrodes 130 may be increased such that the level of the upper surface is increased while the level of the lower surface is constant. As illustrated in FIG. 3A, the stack region 130G of the gate electrodes 130 may extend from the first region R1 toward the second region R2 to have a first gate thickness GT1, and may have a second gate thickness GT2 greater than the first gate thickness GT1 in at least a portion of the pad regions 130P bounded by a dotted line. The second gate thickness GT2 may be in a range of about 150% to about 210% of the first gate thickness GT1.

The gate electrodes 130 may be isolated from each other in the Y-direction by the first isolation regions MS1 extending in the X-direction. The gate electrodes 130 between a pair of first isolation regions MS1 may form a memory block, but various example embodiments of the memory block is not limited thereto. The gate electrodes 130 may include a metal material, such as, for example, tungsten (W). In some example embodiments, the gate electrodes 130 may include polysilicon and/or a metal silicide material.

The interlayer insulating layers 120 may be disposed between the gate electrodes 130. Similarly to the gate electrodes 130, the interlayer insulating layers 120 may be spaced apart from each other in a direction perpendicular to the upper surface of the second substrate 101 and may extend in the X-direction. The interlayer insulating layers 120 may include an insulating material such as silicon oxide and/or silicon nitride.

The first and second isolation regions MS1 and MS2 may penetrate the gate electrodes 130 and may extend in the X-direction. The first and second isolation regions MS1 and MS2 may be disposed parallel to each other. The first and second isolation regions MS1 and MS2 may penetrate entirety of the gate electrodes 130 stacked on the second substrate 101 and may be connected to the second substrate 101. The first isolation regions MS1 may extend as an integrated region in the X-direction, and the second isolation regions MS2 may intermittently extend between a pair of first isolation regions MS1 or may be disposed only in a portion of regions. However, in some example embodiments, the arrangement order of the first and second isolation regions MS1 and MS2 and/or the number of the first and second isolation regions MS1 and MS2 are not limited to the examples illustrated in FIG. 1. As illustrated in FIG. 2B, an isolation insulating layer 105 may be disposed in the first and second isolation regions MS1 and MS2.

As illustrated in FIG. 1, the upper isolation regions SS may extend in the X-direction between the first isolation regions MS1 and the second isolation regions MS2 in the first region R1. As illustrated in FIG. 2B, the upper isolation regions SS may isolate three gate electrodes 130 including the upper gate electrodes 130U in the Y-direction. However, the number of gate electrodes 130 isolated by the upper isolation regions SS may be varied in some example embodiments. The upper gate electrodes 130U isolated by the upper isolation regions SS may form different string selection lines. An upper isolation insulating layer 103 may be disposed on the upper isolation regions SS. The upper isolation insulating layer 103 may include an insulating material, such as, for example, silicon oxide, silicon nitride, or silicon oxynitride.

As illustrated in FIG. 1, each of the channel structures CH may form a memory cell string, and may be spaced apart from each other while forming rows and columns on the first region R1. The channel structures CH may form a grid pattern or may be disposed in a zigzag pattern in one direction. The channel structures CH may have a columnar shape, and may have inclined side surfaces of which a width may decrease toward the second substrate 101 depending on an aspect ratio.

As illustrated in FIG. 2A, the channel structures CH may include first and second channel structures CH1 and CH2 stacked vertically. In each of the channel structures CH, a first channel structure CH1 penetrating through the lower stack structure of the gate electrodes 130 may be connected to a second channel structure CH2 penetrating through the upper stack structure of the gate electrodes 130, and each of the channel structures CH may have a bent portion due to a difference in widths in the connection region. However, in some example embodiments, the number of channel structures stacked in the Z-direction may be varied.

As illustrated in the enlarged diagram in FIG. 2B, the channel layer 140 may be disposed in the channel structures CH. In the channel structures CH, the channel layer 140 may be formed in an annular shape surrounding the channel filling insulating layer 147 therein. The channel layer 140 may be connected to the first horizontal conductive layer 102 in a lower portion. The channel layer 140 may include a semiconductor material such as polysilicon and/or single crystal silicon.

The gate dielectric layer 145 may be disposed between the gate electrodes 130 and the channel layer 140. Although not illustrated in detail, the gate dielectric layer 145 may include a tunneling layer, a charge storage layer, and a blocking layer stacked in sequence from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130. The channel pad 149 may be disposed only on an upper end of the upper second channel structure CH2. The channel pad 149 may include, for example, doped polysilicon.

The channel layer 140, the gate dielectric layer 145, and the channel filling insulating layer 147 may be connected to each other between the first channel structure CH1 and the second channel structure CH2. An upper interlayer insulating layer 125 having a relatively great thickness may be disposed between the first channel structure CH1 and the second channel structure CH2, that is, between the lower stack structure and the upper stack structure. However, the shapes of the interlayer insulating layers 120 and the upper interlayer insulating layer 125 may be varied in the example embodiments.

The dummy channel structures DCH may be spaced apart from each other while forming rows and columns on the second region R2. The dummy channel structures DCH may have a size larger than that of the channel structures CH in the plan diagram, but an example embodiment thereof is not limited thereto. The dummy channel structures DCH may be further disposed on a portion of the first region R1 adjacent to the second region R2. The dummy channel structures DCH may not be electrically connected to upper wiring structures, e.g. may be electrically floating, and differently from the channel structures CH in the semiconductor device 100, the dummy channel structures DCH may not form a memory cell string. The dummy channel structures DCH may provide support, such as mechanical support, and may improve manufacturability of the semiconductor device; however, example embodiments are not limited thereto.

The dummy channel structures DCH may have a structure the same as or different from the channel structures CH. When the dummy channel structures DCH are formed together with the channel structures CH, the dummy channel structures DCH may have the same structure as the channel structures CH. When the dummy channel structures DCH are formed using a portion of the process of forming the gate contact plugs 170, the dummy channel structures DCH may have a different structure from the channel structures CH. In this case, for example, the dummy channel structures DCH may have a structure filled with an insulating material such as oxide.

The gate contact plugs 170 may penetrate the uppermost gate electrodes 130 and the lower insulating structure 160 in the second region R2, and may be connected to pad regions 130P of the gate electrodes 130. The gate contact plugs 170 may penetrate at least a portion of the cell region insulating layer 190 and may be connected to the pad regions 130P of the gate electrodes 130 exposed upwardly, respectively. The gate contact plugs 170 may penetrate the second substrate 101, the second horizontal conductive layer 104, and the horizontal insulating layer 110 below the gate electrodes 130 and may be connected to the internal circuit wiring lines 280 in the peripheral circuit region PERI. The gate contact plugs 170 may be spaced apart from the second substrate 101, the second horizontal conductive layer 104, and the horizontal insulating layer 110 by the substrate insulating layer 121.

As illustrated in FIG. 3A, each of the gate contact plugs 170 may include a vertical extension portion 170V extending in the Z-direction and a horizontal extension portion 170H extending horizontally from the vertical extension portion 170V and in contact with the pad regions 130P. The vertical extension portion 170V may have a cylindrical shape of which a width may decreases toward the second substrate 101 due to an aspect ratio. The horizontal extension portion 170H may be disposed along a circumference of the vertical extension portion 170V, and may extend from a side surface of the vertical extension portion 170V to the other end by a first length L1. The first length L1 may be less than the second length L2 of the lower insulating structure 160.

As illustrated in FIG. 3B, the gate contact plugs 170 may be surrounded by the substrate insulating layer 121 and may be electrically isolated from the second substrate 101. In various example embodiments, a region including lower ends of the gate contact plugs 170 may be surrounded by pad layers 285 on the circuit wiring lines 280. However, in some example embodiments, the gate contact plugs 170 may be in contact with the pad layers 285 without extending into the pad layers 285. The pad layers 285 may be provided to protect the circuit wiring lines 280 during the process of manufacturing the semiconductor device 100, and may include a conductive material, such as, for example, polysilicon.

The gate contact plugs 170 may include, for example, at least one of tungsten (W), copper (Cu), aluminum (Al), and alloys thereof. In some example embodiments, the gate contact plugs 170 may further include barrier layers on sidewalls and bottom surfaces of the contact holes in which the gate contact plugs 170 are disposed. The barrier layer may include, for example, at least one of titanium (Ti), titanium nitride (TiN), tantalum (Ta), and tantalum nitride (TaN).

The insulating structure 160 may be alternately disposed with the interlayer insulating layers 120 and may surround the gate contact plugs 170. The insulating structure 160 may surround side surfaces of the gate contact plugs 170 below the pad regions 130P. An internal side surface of the insulating structure 160 may surround the gate contact plugs 170, and an external side surface of the insulating structure 160 may be surrounded by the gate electrodes 130. The gate contact plugs 170 may be physically and electrically connected to a single gate electrode 130 and may be electrically isolated from the lower gate electrodes 130 by the insulating structure 160.

As illustrated in FIG. 3A, the insulating structure 160 may include a first insulating layer 161 and a second insulating layer 162 surrounding at least a portion of the first insulating layer 161. In various example embodiments, the second insulating layer 162 may surround entirety of first insulating layer 161. Accordingly, the first insulating layer 161 may be spaced apart from the gate electrodes 130, the interlayer insulating layers 120, and the gate contact plugs 170.

In various example embodiments, the first insulating layer 161 may include a seam (S) disposed therein. The seam S may be a space filled with air and/or vacuum without an insulating material disposed thereon. The seam S may be formed as process difficulty increases as the region corresponding to the insulating structure 160 has a fine thickness. However, in some example embodiments, the seam S may not be formed.

The second insulating layer 162 may include a first portion P1 filling a space between the first insulating layer 161 and each of the gate electrodes 130 opposing the first insulating layer 161, and extending from the space onto the upper surface of the first insulating layer 161 and the lower surface of the first insulating layer 161. The first portion P1 may have a substantially uniform thickness. In the example embodiments, the configuration in which thicknesses are "substantially" the same may include the configuration in which the thicknesses are completely the same, and also the configuration in which there may be a slight difference in thicknesses due to an error in a process, despite being formed through the same process, which may be the same as when the term "substantially" is not used. The second insulating layer 162 may further include a second portion P2 other than the first portion P1. The second portion P2 may be disposed in a space between the first insulating layer 161 and the gate contact plugs 170. The second portion P2 may be in contact with the gate contact plugs 170. The first portion P1 and the second portion P2 may be integrally (e.g., continuously) connected to each other. That is, the first portion P1 and the second portion P2 may be an integrated material layer formed of the same material and a boundary therebetween may arbitrarily distinct.

The first portion P1 may have a first thickness t1, and the second portion P2 may have a second thickness t2. In various example embodiments, the first thickness t1 and the second thickness t2 may be the same, but various example embodiments thereof is not limited thereto. The first thickness t1 may be, for example, in a range of about 80 Å to about 100 Å.

The first and second insulating layers 161 and 162 may include an insulating material, such as, for example, at least one of oxide, silicon oxide, silicon nitride, and silicon oxynitride. The first and second insulating layers 161 and 162 may include different insulating materials. For example, the first insulating layer 161 may include silicon oxide, and the second insulating layer 162 may include silicon oxynitride.

Referring to FIG. 3A, the first gate contact plug 170*a* of the gate contact plugs 170 may penetrate the pad region 130P of the first gate electrode 130*a* among the gate electrodes 130 and may penetrate the stack region 130G of the second gate electrode 130*b* among the gate electrodes 130 disposed below the first gate electrode 130*a*.

The first gate contact plug 170*a* may be electrically connected to the first gate electrode 130*a* and may be electrically isolated from the other gate electrodes 130 including the second gate electrode 130*b*. The insulating structure 160 may be disposed between a space between the second gate electrode 130*b* and the first gate contact plug 170*a* and may electrically isolate the second gate electrode 130*b* from the first gate contact plug 170*a*.

Since the insulating structure 160 may include a double-layered structure of the first and second insulating layers 161 and 162, the issue in which productivity is reduced as the second gate electrode 130*b* is electrically connected to the first gate contact plug 170*a* during the process of manufacturing the semiconductor device may be at least partially addressed. For example, since the second insulating layer 162 having etch resistance relatively stronger than that of the first insulating layer 161 for a specific etching condition is included, the removal of the insulating structure 160 by an etching process may be prevented or reduced in likelihood of occurrence and/or in impact from occurring. Accordingly, the semiconductor device 100 having improved electrical properties and improved production yield may be provided.

The through plugs 175 may be disposed on the third region R3 of the memory cell region CELL, which may be an external side region of the second substrate 101, may penetrate the cell region insulating layer 190 and may extend to a peripheral circuit region PERI. The through plugs 175 may be disposed to connect the cell wiring lines 195 of the memory cell region CELL to the circuit wiring lines 280 of the peripheral circuit region PERI. The through plugs 175 may include a conductive material, such as, for example, a metal material such as tungsten (W), copper (Cu), or aluminum (Al). The through plugs 175 may be formed in the same process of forming the gate contact plugs 170 and may include the same material, and may have the same internal structure as that of the gate contact plugs 170.

The cell region insulating layer 190 may be disposed to cover the second substrate 101, the gate electrodes 130 on the second substrate 101, and the peripheral region insulating layer 290. The cell region insulating layer 190 may be formed of an insulating material, or may include a plurality of insulating layers.

The cell wiring lines 195 may be included in an upper wiring structure electrically connected to the memory cells in the memory cell region CELL. The cell wiring lines 195 may be connected to the gate contact plugs 170 and the through plugs 175, and may be electrically connected to the gate electrodes 130 and the channel structures CH. In some example embodiments, the number of contact plugs and wiring lines included in the upper wiring structure may be varied. The cell wiring lines 195 may include a metal, such as, for example, tungsten (W), copper (Cu), aluminum (Al), or the like.

Figure 4:
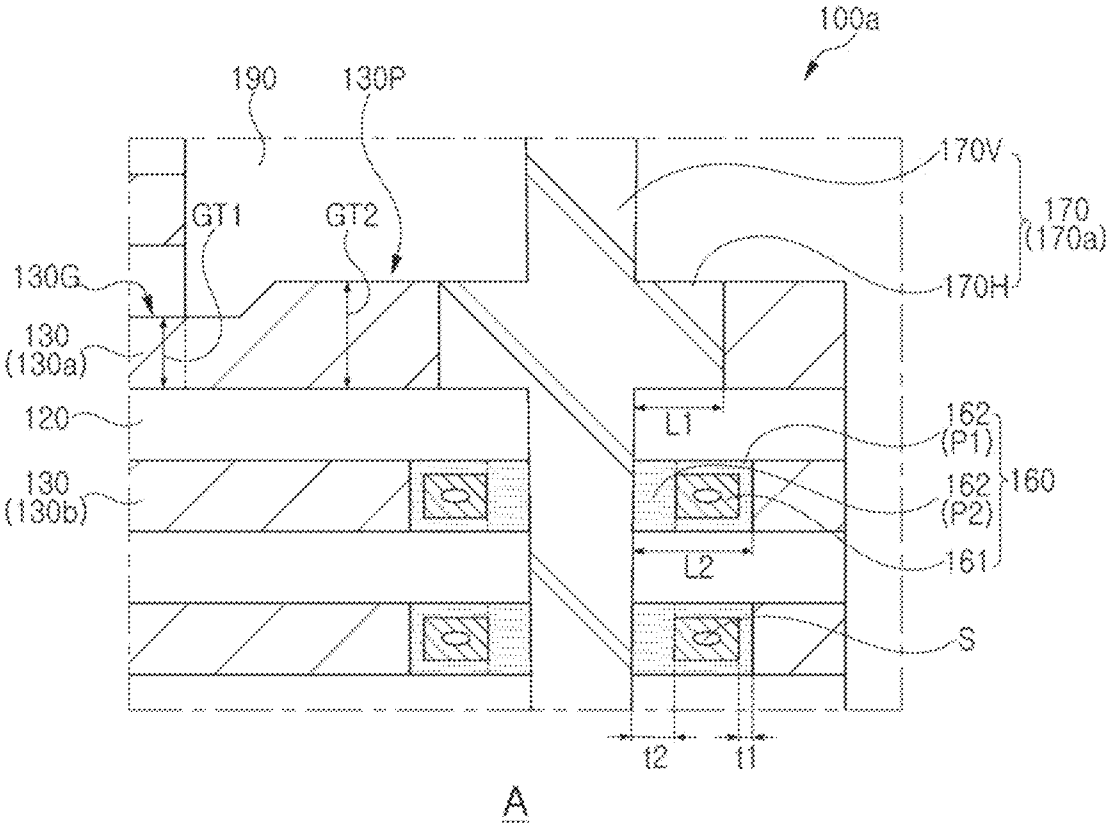
FIG. 4 is an enlarged diagram illustrating a portion of a semiconductor device according to various example embodiments.

FIG. 4 is an enlarged diagram illustrating a portion of a semiconductor device 100*a* according to various example embodiments, illustrating region "A" in FIG. 2A.

Referring to FIG. 4, the semiconductor device 100*a* may include an insulating structure 160 different from the semiconductor device 100 in FIGS. 1 to 3B. The second insulating layer 162 may include a first portion P1 covering the upper and lower surfaces of the first insulating layer 161 and an external side surface opposing the gate electrodes 130, and a second portion P2 covering an internal side surfaces opposing the gate contact plugs 170 of the first insulating layer 161. In the second insulating layer 162, the first portion P1 and the second portion P2 may have different thicknesses. For example, the first and second portions P1 and P2 may have a substantially uniform thickness, and the second thickness t2 of the second portion P2 may be greater than the first thickness t1 of the first portion P1, which may be because, referring to FIG. 10H, the thickness of the second portion P2 may be adjusted according to specific conditions of an oxidation process. As the second thickness t2 of the second portion P2 increases, the removal of the insulating structure 160 may be efficiently prevented from, or reduced in likelihood of occurrence of and/or of impact from occurrence of, etching in a subsequent process, thereby providing a semiconductor device having improved production yield. However, in some embodiments, a second thickness of the second portion P2 may be smaller than a first thickness of the first portion P1.

Figure 5:
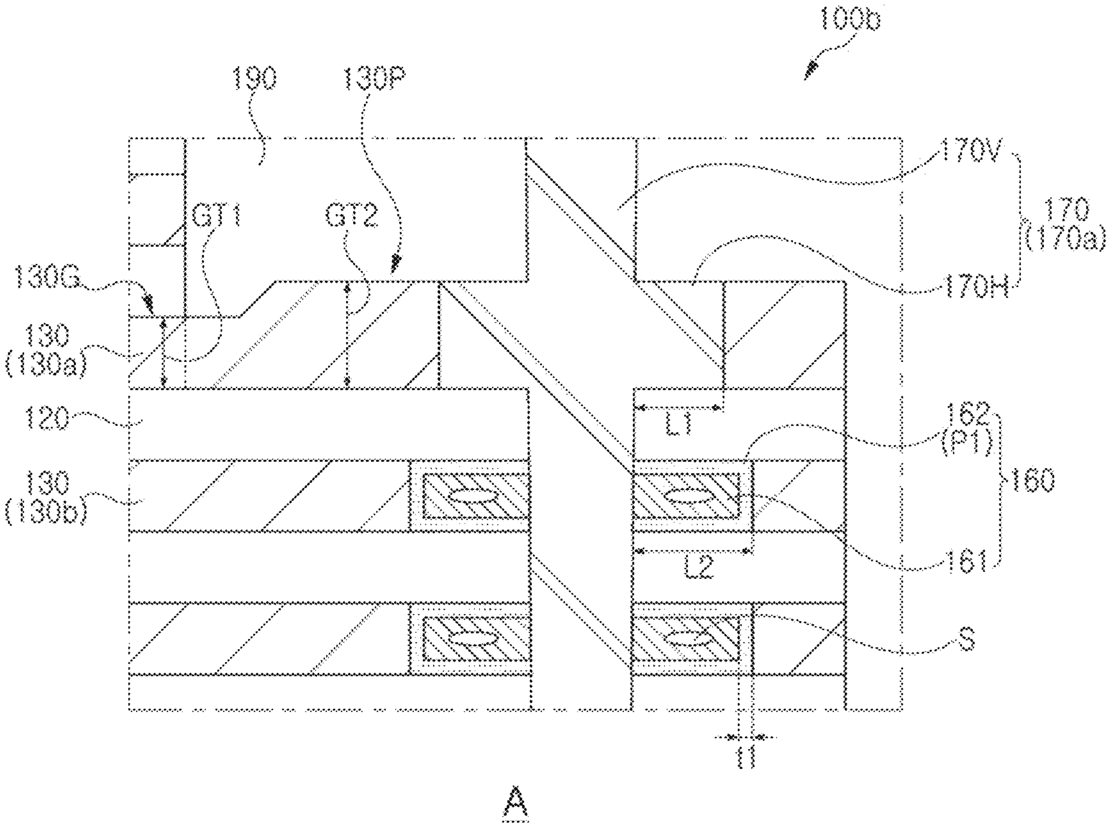
FIG. 5 is an enlarged diagram illustrating a portion of a semiconductor device according to various example embodiments.

FIG. 5 is an enlarged diagram illustrating a portion of a semiconductor device 100*b* according to various example embodiments, illustrating a region corresponding to region "A" in FIG. 2A.

Referring to FIG. 5, the semiconductor device 100*b* may not include the second portion P2. The second insulating layer 162 may include only the first portion P1 covering the upper surface of the first insulating layer 161, the lower surface of the first insulating layer 161, and the side surfaces opposing the gate electrodes 130 of the first insulating layer 161, and may not include the second portion P2. Accordingly, the first insulating layer 161 may be spaced apart from the gate electrodes 130 and/or the interlayer insulating layers 120, and may be in contact with the gate contact plugs 170. That is, the second insulating layer 162 may cover the external side surface of the first insulating layer 161 and may expose the internal side surface of the first insulating layer 161, with respect to the first insulating layer 161 surrounding the gate contact plugs 170, which may be because, similarly to the example described in FIG. 4, the thickness of the second portion P2 may be adjusted according to an oxidation process in FIG. 10H. For example, when the thickness of the oxide layer according to an oxidation process is relatively thin, a portion corresponding to the second portion P2 may be removed in a subsequent process such as an etching process.

Figure 6:
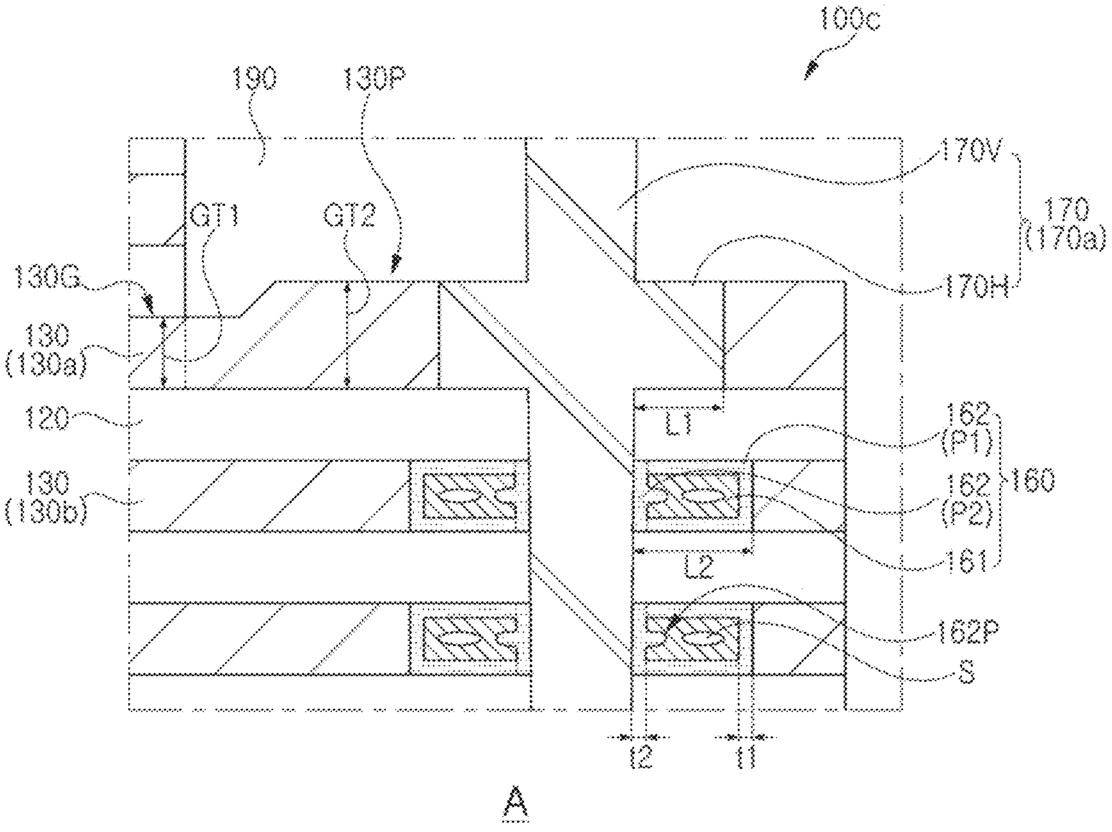
FIG. 6 is an enlarged diagram illustrating a portion of a semiconductor device according to various example embodiments.

FIG. 6 is an enlarged diagram illustrating a portion of a semiconductor device 100*c* according to various example embodiments, illustrating a region corresponding to region "A" in FIG. 2A.

Referring to FIG. 6, the semiconductor device 100*c* may include a second insulating layer 162 including a protrusion 162P. The second insulating layer 162 may include a protrusion 162P surrounding the first insulating layer 161 and extending in a direction toward the first insulating layer 161. In various example embodiments, the protrusion 162P may protrude from the second portion P2 toward the internal portion of the first insulating layer 161. Accordingly, the first insulating layer 161 may include a recess formed by the protrusion 162P. The shape of the protrusion 162P may be varied into various shapes different from the illustrated examples.

Figure 7:
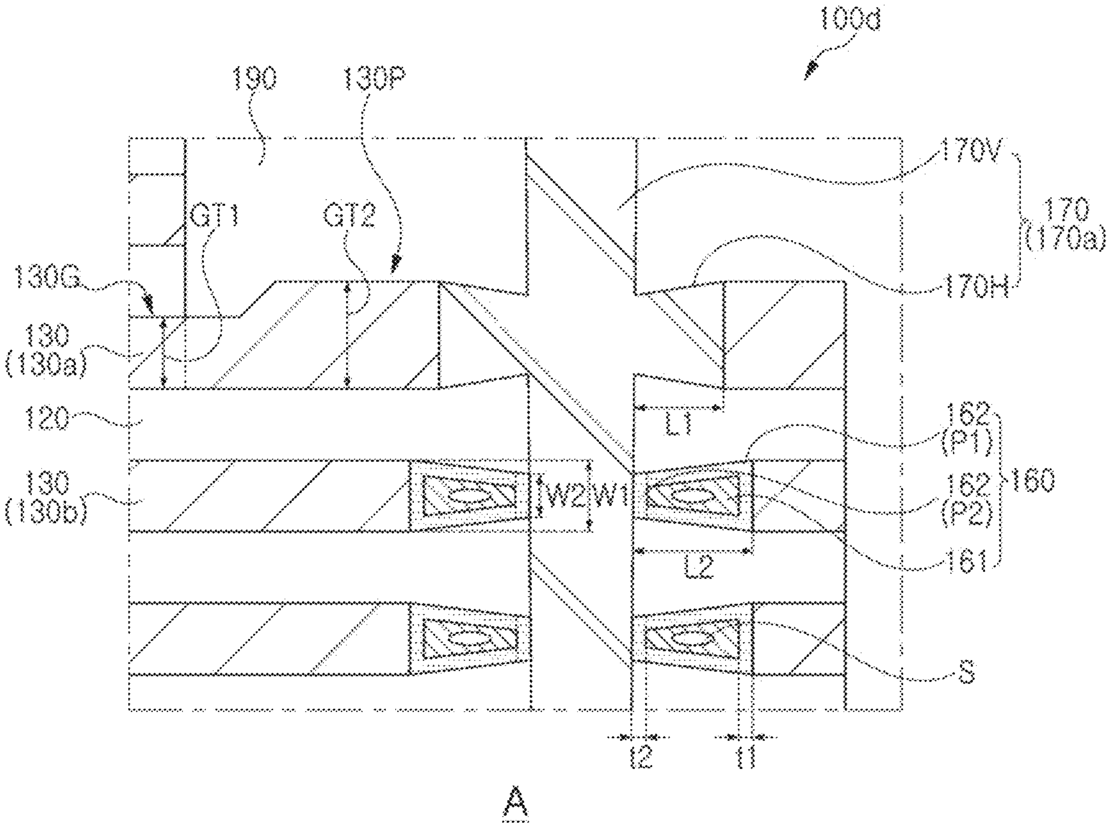
FIG. 7 is an enlarged diagram illustrating a portion of a semiconductor device according to various example embodiments.

FIG. 7 is an enlarged diagram illustrating a portion of a semiconductor device according to various example embodiments, illustrating a region corresponding to region "A" in FIG. 2A.

Referring to FIG. 7, the semiconductor device 100*d* may include a structure of an insulating structure 160 different from that of the semiconductor device 100 in FIGS. 1 to 3B. A first width W1 of the insulating structure 160 in the Z-direction on a surface opposing each of the gate electrodes 130 may be greater than a second width W2 in the Z-direction on a surface opposing each of the gate contact plugs 170, which may be formed as width of the tunnel portions TL3 and TL4 are decreased by the sacrificial layer 122 or byproducts other in the etching process in FIG. 10F. A difference between the first width W1 and the second width W2 may be in a range of about 1 nm to about 4 nm, but various example embodiments thereof is not limited thereto. Due to the tunnel portions TL3 and TL4 with the decreased width, the size of the seam S may relatively increase or the gate contact plugs 170 may not be isolated from the gate electrodes 130, such that process difficulty may increase. However, process difficulty may be addressed by the insulating structure 160 having a double-layer structure including the first insulating layer 161 and the second insulating layer 162.

In various example embodiments, the width of the insulating structure 160 in the Z-direction may continuously decrease from the second gate electrode 130*b* toward the first gate contact plug 170*a*. Alternatively, the insulating structure 160 may further include a portion having a constant thickness from the second gate electrode 130*b* toward the first gate contact plug 170*a* and may further include a portion having a decreased width in the Z-direction.

Figure 8:
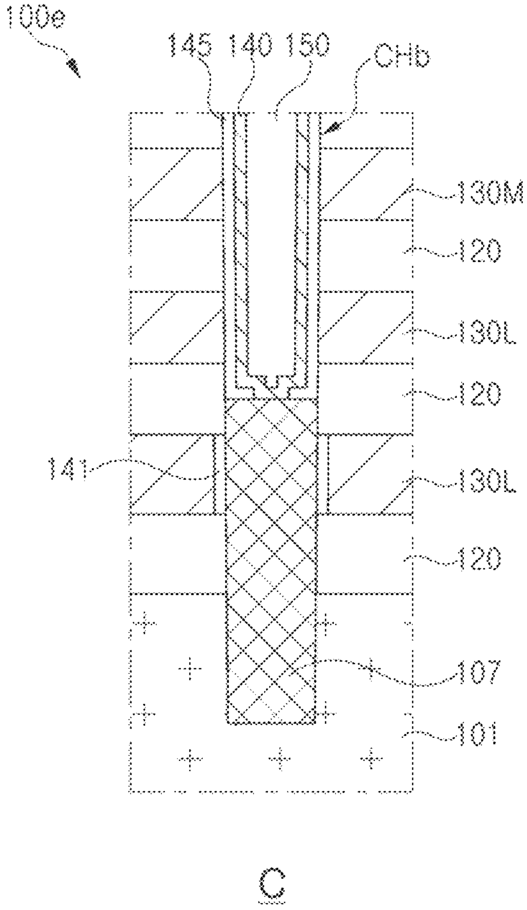
FIG. 8 is an enlarged diagram illustrating a portion of a semiconductor device according to various example embodiments.

FIG. 8 is an enlarged diagram illustrating a portion of a semiconductor device 100*e* according to various example embodiments, illustrating a region corresponding to region "D" in FIG. 2B.

Referring to FIG. 8, in the semiconductor device 100*e*, the memory cell region CELL may not include first and second horizontal conductive layers disposed on the second substrate 101, differently from the example embodiment in FIGS. 2A and 2B. Also, the channel structure CHb may further include an epitaxial layer 107.

The epitaxial layer 107 may be disposed on the second substrate 101 on the lower end of the channel structure CHb, and may be disposed on a side surface of the at least one gate electrode 130. The epitaxial layer 107 may be disposed in the recessed region of the second substrate 101. The level of the lower surface of the epitaxial layer 107 may be higher than or above a level of the upper surface of the lowermost lower gate electrode 130L and lower than the lower surface of the upper lower gate electrode 130L, but various example embodiments thereof is not limited thereto. The epitaxial layer 107 may be connected to the channel layer 140 through the upper surface. A gate insulating layer 141 may be further disposed between the epitaxial layer 107 and the lower gate electrode 130L in contact with the epitaxial layer 107.

Figure 9:
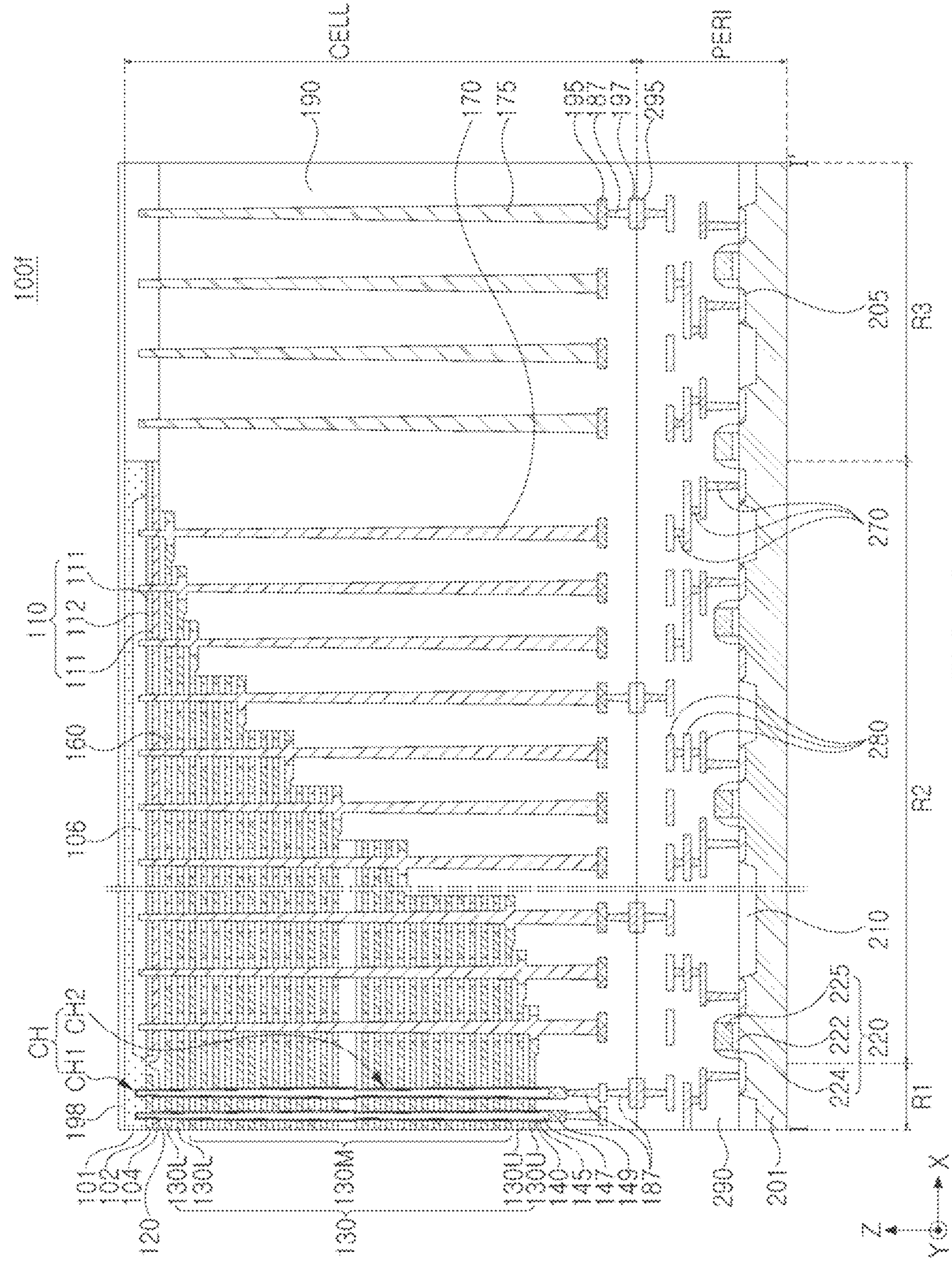
FIG. 9 is a cross-sectional diagram illustrating a semiconductor device according to various example embodiments.

FIG. 9 is a cross-sectional diagram illustrating a semiconductor device 100*f* according to various example embodiments.

Referring to FIG. 9, the semiconductor device 100*f* may have a structure in which the peripheral circuit region PERI and the memory cell region CELL are vertically bonded to each other. To this end, the peripheral circuit region PERI may further include first bonding metal layers 295, and the memory cell region CELL may include the upper plugs 187, the second bonding metal layers 197, and a passivation layer 198 on the second substrate 101. Also, upper ends of the gate contact plugs 170 and the through plugs 175 may be disposed in the second substrate 101.

The first bonding metal layers 295 may be disposed on the circuit contact plugs 270 and the circuit wiring lines 280, such that the upper surface of the first bonding metal layer 295 may be exposed to the upper surface of the peripheral circuit region PERI through the peripheral region insulating layer 290. The second bonding metal layers 197 may be disposed below the upper plugs 187, such that a lower surface of the second bonding metal layer 197 may be exposed to the lower surface of the memory cell region CELL through the cell region insulating layer 190. The first bonding metal layers 295 and the second bonding metal layers 197 may each include a same or different conductive material, such as, for example, copper (Cu). In some example embodiments, each of the peripheral region insulating layer 290 and the cell region insulating layer 190 may further include a bonding dielectric layer surrounding the first bonding metal layers 295 and the second bonding metal layers 197 and disposed at a predetermined depth from the upper surface. The bonding dielectric layer may include, for example, at least one of SiO, SiN, SiCN, SiOC, SiON, and SiOCN. The passivation layer 198 may be disposed on the second substrate 101 to protect the second substrate 101, and may include an insulating material.

The peripheral circuit region PERI and the memory cell region CELL may be bonded to each other by bonding the first bonding metal layers 295 to the second bonding metal layers 197 and bonding the bonding dielectric layers to each other. The bonding of the first bonding metal layers 295 and the second bonding metal layers 197 may be, for example, a copper (Cu)-copper (Cu) bonding, and the bonding of the bonding dielectric layers may be, for example, dielectric-dielectric bonding such as SiCN—SiCN bonding. The peripheral circuit region PERI and the memory cell region CELL may be bonded by hybrid bonding including copper (Cu)-copper (Cu) bonding and dielectric-dielectric bonding.

The upper ends of the gate contact plugs 170 may be electrically isolated from each other in the second substrate 101. To this end, the second substrate 101 may include an insulating region 106, and upper ends of the gate contact plugs 170 may be disposed in the insulating region 106. However, in some example embodiments, the second substrate 101 may have a divided shape such that the gate contact plugs 170 are electrically isolated from each other, instead of including the insulating region 106.

Figure 10A:
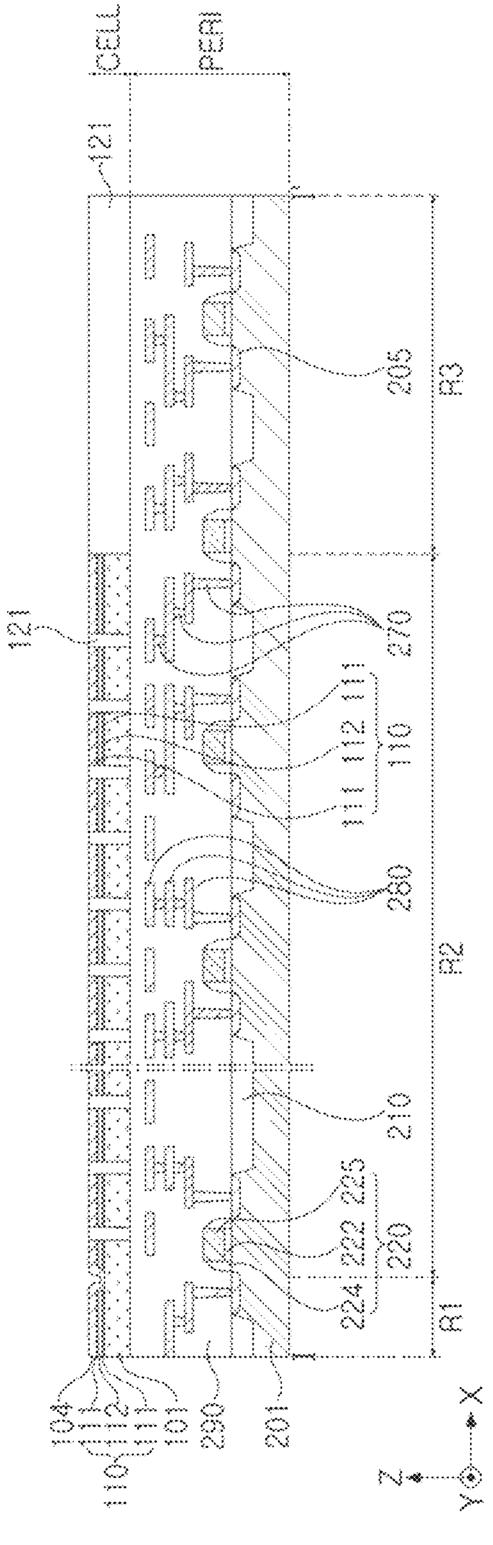
FIGS. 10A to 10L are cross-sectional diagrams and enlarged diagrams illustrating a method of manufacturing a semiconductor device according to various example embodiments.
Figure 10B:
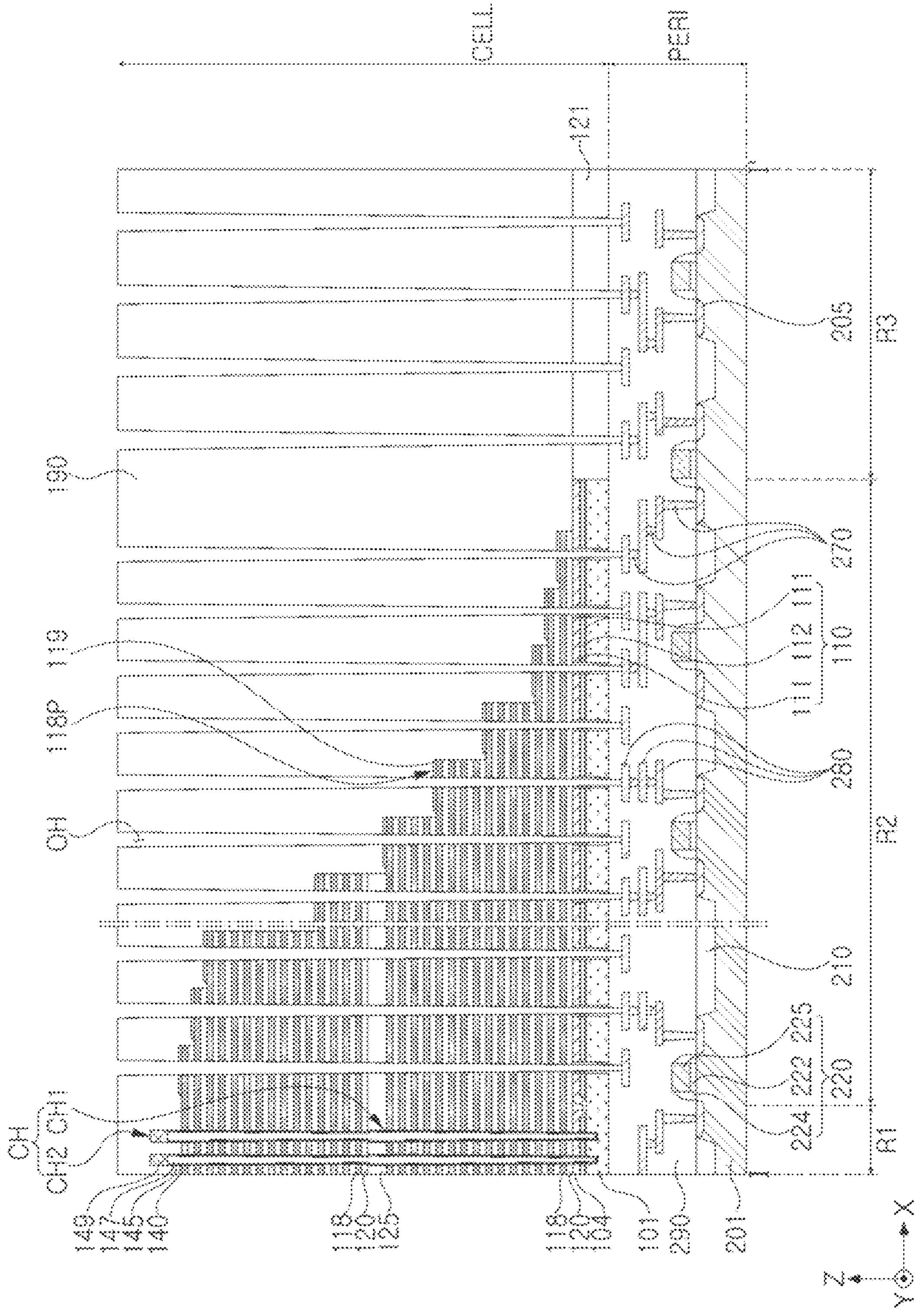
Figure 10C:
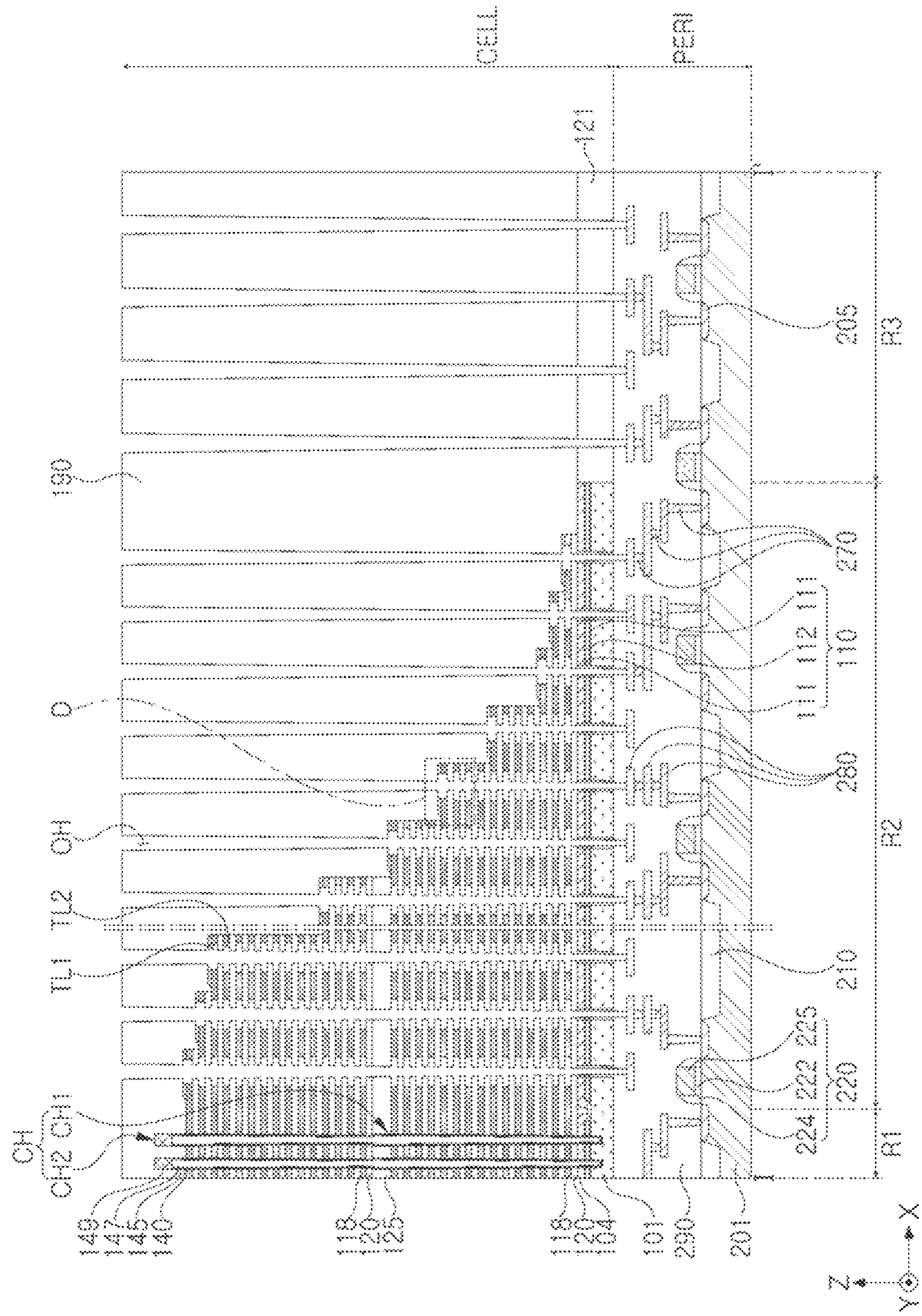
Figure 10D:
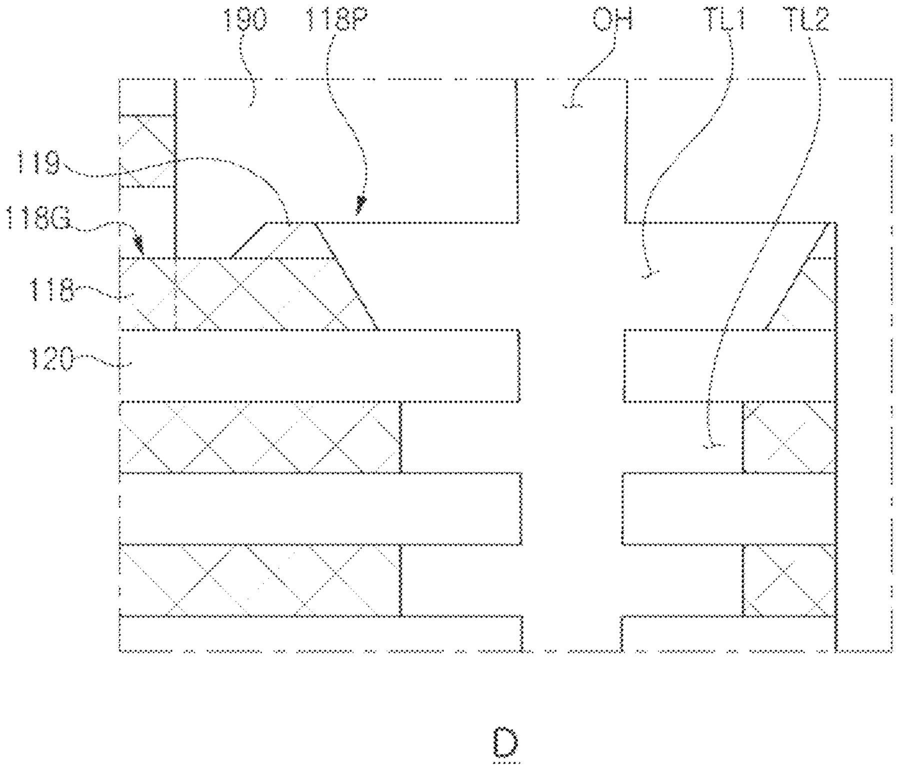
Figure 10E:
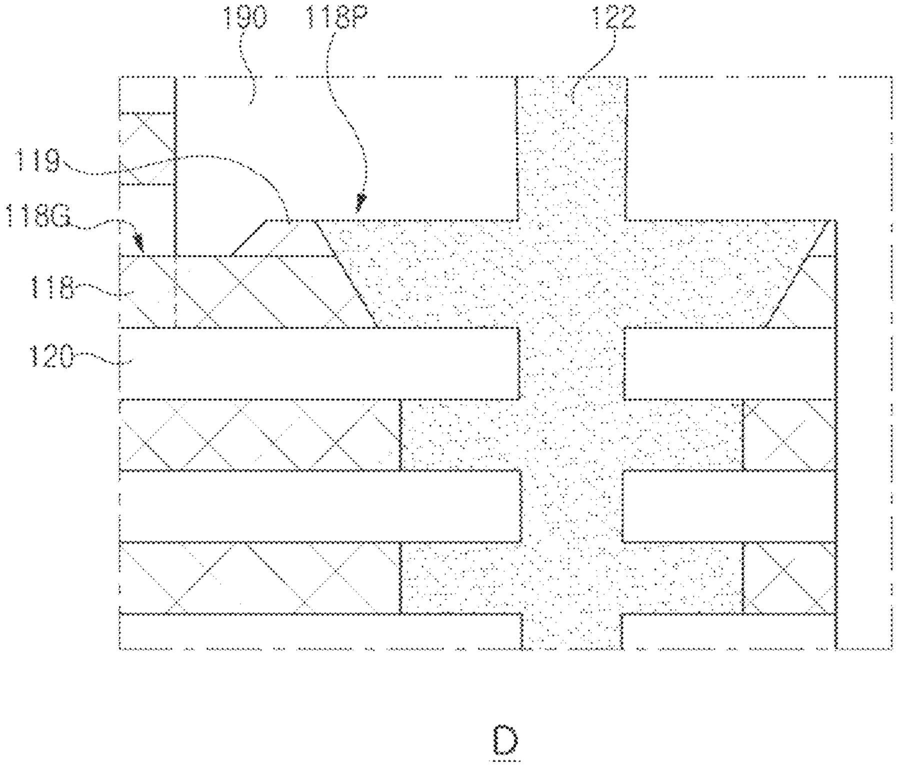
Figure 10F:
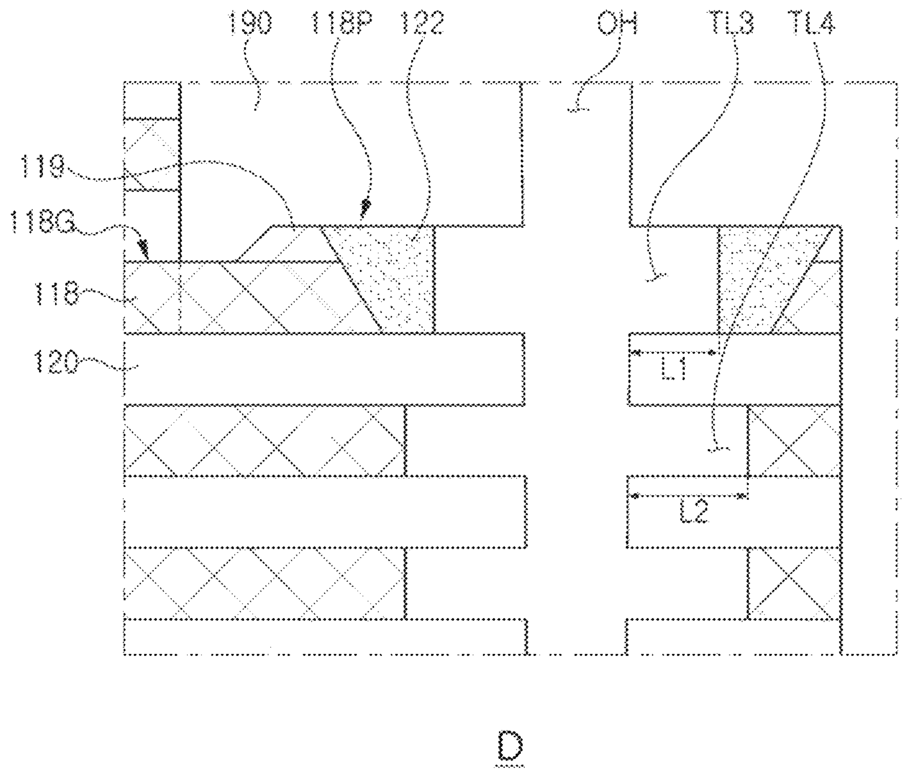
Figure 10G:
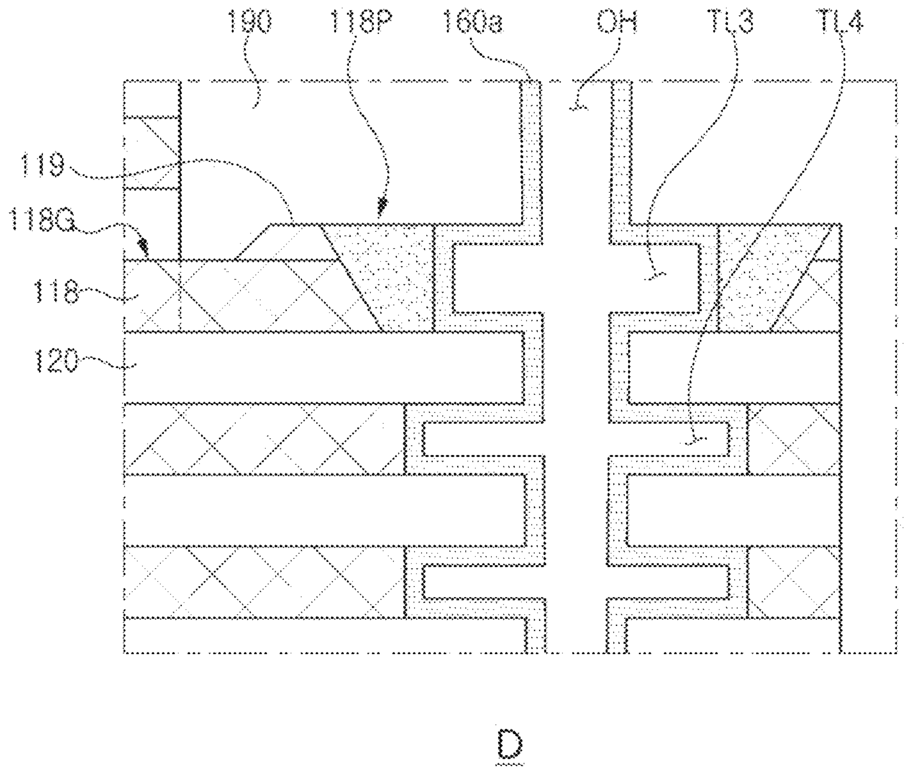
Figure 10H:
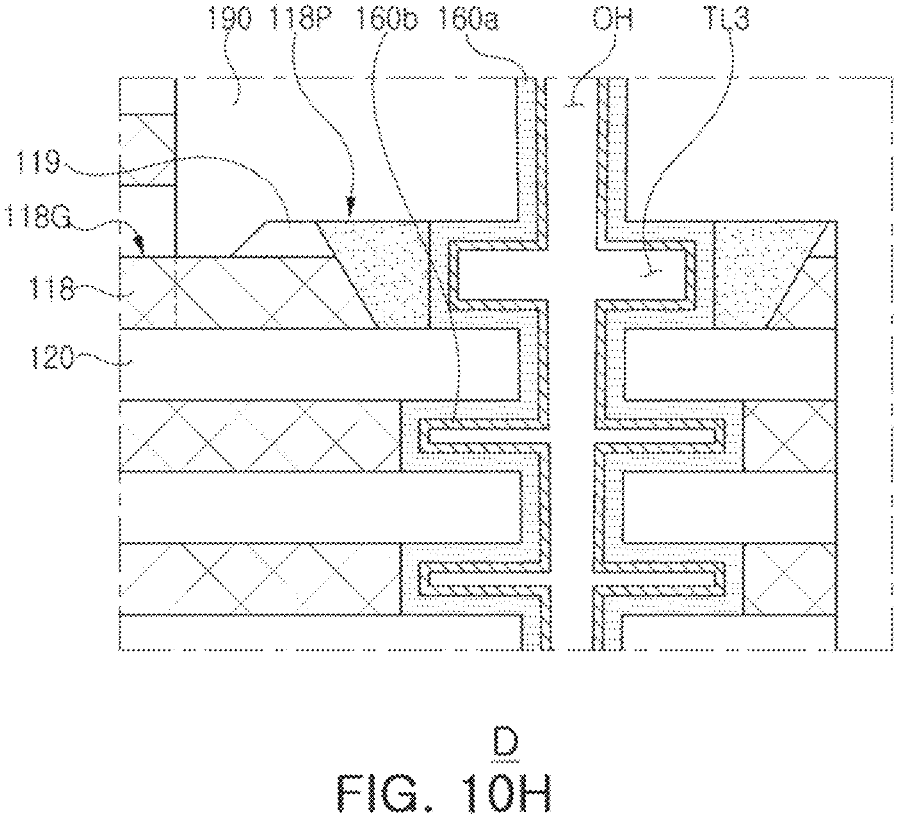
Figure 10I:
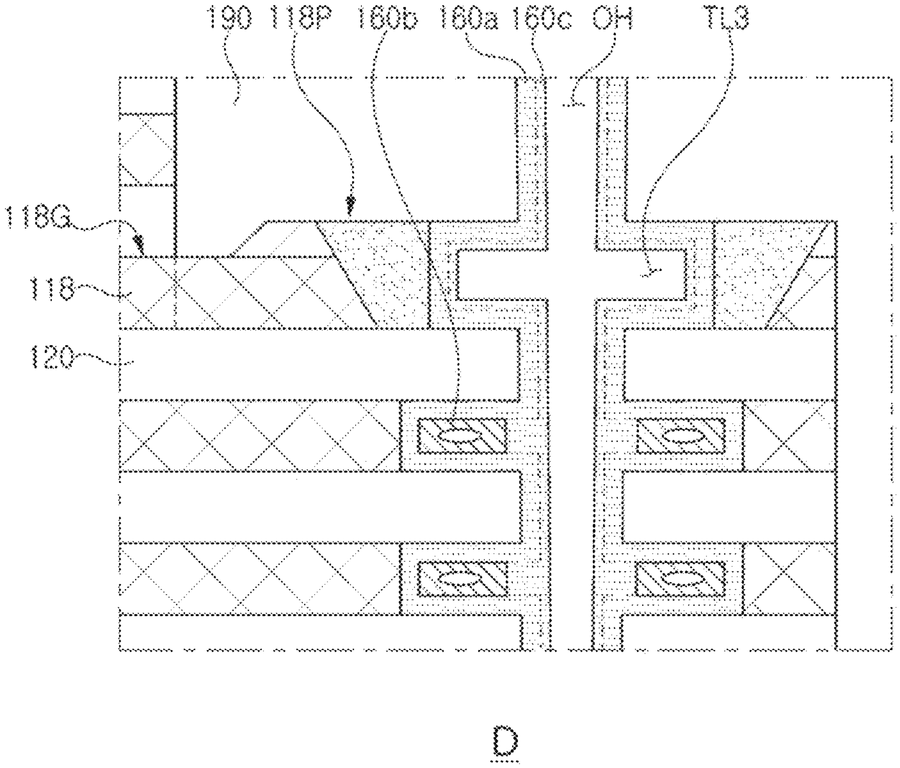
Figure 10J:
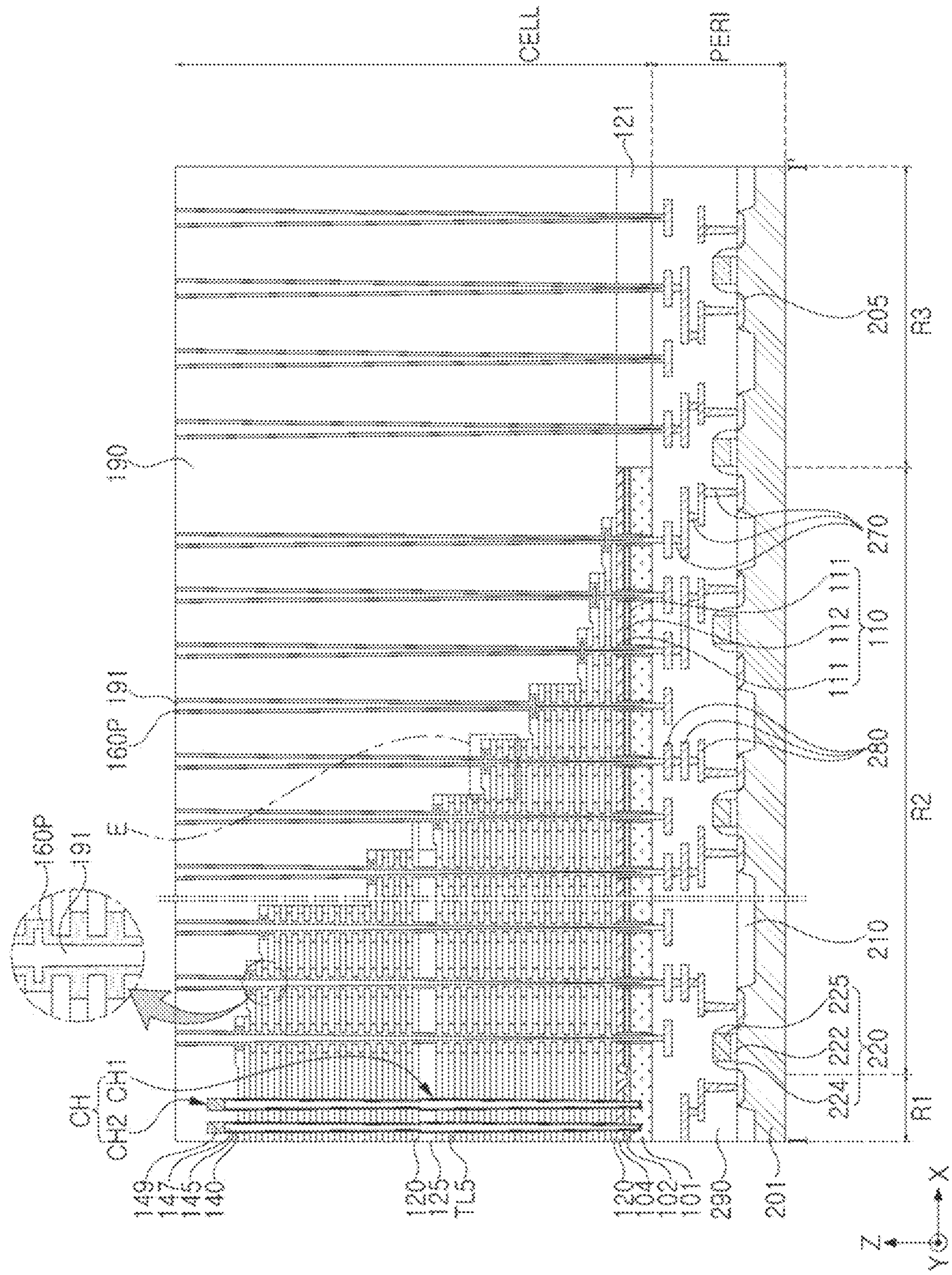
Figure 10K:
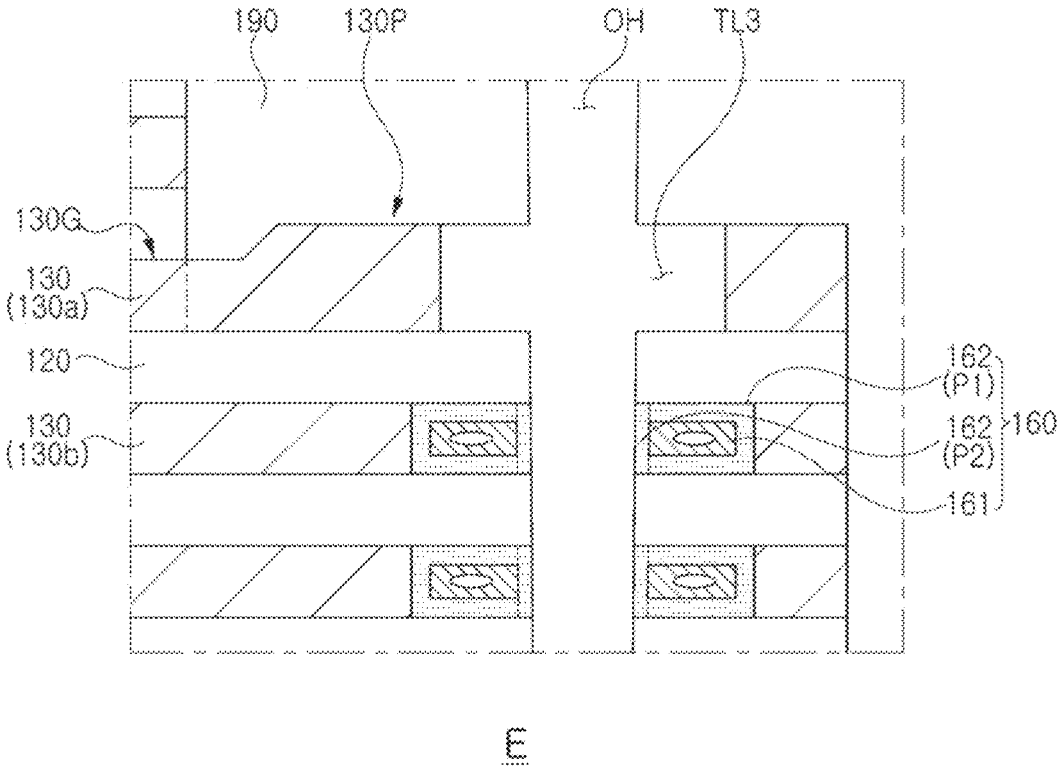

FIGS. 10A to 10L are cross-sectional diagrams and enlarged diagrams illustrating a method of manufacturing a semiconductor device 100 according to various example embodiments. FIGS. 10D to 10I are enlarged diagrams corresponding to region "D" in FIG. 10C, and FIG. 10K is an enlarged diagram corresponding to region "E" in FIG. 10J.

Referring to FIG. 10A, a peripheral circuit region PERI including circuit devices 220 and lower wiring structures may be formed on a first substrate 201, and a second substrate 101 on which a memory cell region CELL is provided, a horizontal insulating layer 110, a second horizontal conductive layer 104, and a substrate insulating layer 121 may be formed on the peripheral circuit region PERI.

The device isolation layers 210 may be formed in the first substrate 201, and the circuit gate dielectric layer 222 and the circuit gate electrode 225 may be formed in sequence on the first substrate 201. The device isolation layers 210 may be formed by, for example, a shallow trench isolation (STI) process. The circuit gate dielectric layer 222 and the circuit gate electrode 225 may be formed using atomic layer deposition (ALD) and/or chemical vapor deposition (CVD). The circuit gate dielectric layer 222 may be formed of silicon oxide, and the circuit gate electrode 225 may be formed of at least one of polycrystalline silicon or a metal silicide layer, but various example embodiments thereof is not limited thereto. Thereafter, a spacer layer 224 and source/drain regions 205 may be formed on both sidewalls of the circuit gate dielectric layer 222 and the circuit gate electrode 225. In some example embodiments, the spacer layer 224 may include a plurality of layers. Thereafter, the source/drain regions 205 may be formed by performing an ion implantation process.

Among the lower wiring structures, the circuit contact plugs 270 may be formed by partially forming the insulating layer 290 in the peripheral region, removing a portion thereof by etching, and filling a conductive material therein. The circuit wiring lines 280 may be formed by, for example, depositing a conductive material and patterning the conductive material.

The peripheral region insulating layer 290 may include a plurality of insulating layers. A portion of the peripheral region insulating layer 290 may be formed in each process of forming the lower wiring structures, and a portion thereof may be formed on the uppermost circuit wiring line 280, such that the circuit devices 220 and the lower portion may be formed to cover the wiring structures.

Thereafter, the second substrate 101 may be formed on the peripheral region insulating layer 290. The second substrate 101 may be formed of, for example, polycrystalline silicon, and may be formed by a CVD process. Polycrystalline silicon included in the second substrate 101 may include impurities.

The first and second horizontal insulating layers 111 and 112 included in the horizontal insulating layer 110 may be alternately stacked on the second substrate 101. The horizontal insulating layer 110 may be partially replaced with the first horizontal conductive layer 102 in FIG. 2A through a subsequent process. The first horizontal insulating layers 111 may include a material different from that of the second horizontal insulating layer 112. For example, the first horizontal insulating layers 111 may be formed of the same material as that of the interlayer insulating layers 120, and the second horizontal insulating layer 112 may be formed of the same material as that of the sacrificial insulating layers 118 subsequently formed. The horizontal insulating layer 110 may be partially removed by a patterning process in a portion of regions, that is, for example, on the second region R2 of the second substrate 101.

The second horizontal conductive layer 104 may be formed on the horizontal insulating layer 110, and may be in contact with the second substrate 101 in a region from which the horizontal insulating layer 110 is removed. Accordingly, the second horizontal conductive layer 104 may be bent along end portions of the horizontal insulating layer 110, may cover the ends, and may extend to the second substrate 101.

The substrate insulating layer 121 may penetrate the second substrate 101 in regions of the second region R2 in which the gate contact plugs 170 (see FIG. 2A) are disposed and the third region R3. The substrate insulating layer 121 may be formed by removing a portion of the second substrate 101, the horizontal insulating layer 110, and the second horizontal conductive layer 104, and filling an insulating material therein. After the insulating material is filled, a planarization process may be further performed using a chemical mechanical polishing (CMP) process. Accordingly, the upper surface of the substrate insulating layer 121 may be substantially coplanar with or at the same level with or flush with the upper surface of the second horizontal conductive layer 104.

Referring to FIG. 10B, the sacrificial insulating layers 118 and the interlayer insulating layers 120 included in a stack structure may be alternately stacked on the second horizontal conductive layer 104, a stepped or staircase structure may be formed, channel structures CH may be formed, and openings OH penetrating through the stack structure may be formed.

As described above, the sacrificial insulating layers 118 and the interlayer insulating layers 120 may be alternately stacked on the second horizontal conductive layer 104. The sacrificial insulating layers 118 may be replaced with the gate electrodes 130 (see FIG. 2A) through a subsequent process. The sacrificial insulating layers 118 may be formed of a material different from that of the interlayer insulating layers 120, and may be formed of a material etched with etch selectivity for the interlayer insulating layers 120 under specific etching conditions. For example, the interlayer insulating layers 120 may be formed of at least one of silicon oxide and silicon nitride, and the sacrificial insulating layers 118 may be formed of a material different from a material of the interlayer insulating layers 120 selected from silicon, silicon oxide, silicon carbide, and silicon nitride. In some example embodiments, the thicknesses of the interlayer insulating layers 120 may not all be the same. Also, the thicknesses of the interlayer insulating layers 120 and the sacrificial insulating layers 118 and/or the number of films included in the interlayer insulating layers 120 and the sacrificial insulating layers 118 may be varied from the illustrated examples.

Thereafter, on the second region R2, a photolithography process and an etching process may be repeatedly performed on the upper sacrificial insulating layers 118 using a mask layer to allow an upper sacrificial insulating layers 118 to extend less than a lower sacrificial insulating layers 118. Accordingly, the sacrificial insulating layers 118 may form a stepped structure by a predetermined unit, and the sacrificial pad regions 118P disposed on an uppermost portion of the sacrificial insulating layers 118 may be exposed upwardly. Thereafter, a sacrificial pad insulating layer 119 may be further formed on the sacrificial insulating layers 118 disposed in the sacrificial pad regions 118P. The sacrificial pad insulating layer 119 may include silicon nitride. The sacrificial pad insulating layer 119 may include a material different from that of the sacrificial insulating layers 118, but various example embodiments thereof is not limited thereto. The sacrificial pad insulating layer 119 may form the sacrificial pad regions 118P together with the sacrificial insulating layers 118, may be replaced with a conductive material together with the sacrificial insulating layers 118 through a subsequent process and may form each pad region 130P of the electrodes 130.

Thereafter, channel structures CH may be formed in channel holes penetrating through the stack structure. Specifically, a cell region insulating layer 190 covering the stack structure may be formed, and a gate dielectric layer 145, a channel layer 140, a channel filling insulating layer 147, and a channel pad 149 may be formed in sequence in the channel holes, thereby forming the channel structures CH. The channel layer 140 may be formed of a conductive material, such as, for example, polycrystalline silicon.

In various example embodiments, the stack structure may be formed by forming a lower stack structure, forming a lower stepped structure and a portion of the cell region insulating layer 190 covering the lower stepped structure, forming the stack structure on the lower stack structure, and further forming an upper stepped structure and the other cell region insulating layer 190. In this case, a lower channel hole penetrating through the lower stepped structure and an upper channel hole penetrating through the upper stepped structure may be separately formed to form the channel structures CH. Accordingly, the channel structures CH may include a first channel structure CH1 corresponding to the lower channel hole and a second channel structure CH2 corresponding to the upper channel hole.

Thereafter, openings OH may be formed in regions in which the gate contact plugs 170 and the through plugs 175 in FIG. 2A are formed. Before forming the openings OH, a portion of the cell region insulating layer 190 covering the channel structures CH may be further formed. The openings OH may have a cylindrical hole shape, may penetrate the substrate insulating layer 121 and may extend to the peripheral circuit region PERI. Although not specifically illustrated, the openings OH may be formed to expose the pad layers 285 (see FIG. 3B) on the circuit wiring lines 280.

Referring to FIGS. 10C and 10D, tunnel portions TL1 and TL2 may be formed by partially removing the sacrificial insulating layers 118 exposed through the openings OH.

Tunnel portions TL1 and TL2 may be formed by removing the sacrificial insulating layers 118 by a predetermined length around the openings OH by injecting an etchant through the openings OH. The tunnels TL1 and TL2 may include the first tunnels TL1 penetrating through a portion of the sacrificial insulating layers 118 and the sacrificial pad insulating layer 119 of the sacrificial pad regions 118P and the second tunnel portions TL2 penetrating through the sacrificial insulating layers 118 disposed below the sacrificial pad regions 118P.

As illustrated in FIG. 10D, the first tunnel portions TL1 may be formed to have a length relatively longer than that of the second tunnel portions TL2. Also, each of the first tunnel portions TL1 may have an inclined side shape, which may be because the sacrificial insulating layers 118 and the sacrificial pad insulating layer 119 include different materials, that is, because the sacrificial pad insulating layer 119 may have an etching rate relatively higher than that of the sacrificial insulating layers 118 under a specific etching condition. However, the shape of the first tunnel portions TL1 is not limited thereto and may be varied.

Referring to FIG. 10E, the sacrificial layer 122 may be formed in the openings OH and the tunnels TL1 and TL2. The sacrificial layer 122 may be formed of an insulating material, such as, for example, silicon oxide, silicon nitride, silicon oxynitride, or a combination thereof. The sacrificial layer 122 may be formed of a material having an etching rate lower than that of the sacrificial insulating layers 118 and the sacrificial pad insulating layer 119 under a specific etching condition.

Referring to FIG. 10F, third and fourth tunnel portions TL3 and TL4 may be formed by removing a portion of the sacrificial layer 122 and the sacrificial insulating layers 118. That is, the sacrificial layer 122 in a region corresponding to the openings OH may be removed, and an etching process in which the sacrificial layer 122 surrounding the openings OH may be further removed may be performed. In the etching process, the sacrificial layer 122 may have an etching rate lower than that of the sacrificial insulating layers 118 and the sacrificial pad insulating layer 119. Accordingly, the third tunnel portions TL3 having a first length L1 less than a length of the first tunnel portions TL1 and the fourth tunnel portions TL4 having a second length L2 greater than a length of the second tunnel portions TL2 may be formed. The first length L1 may be less than the second length L2. That is, the third tunnel portions TL3 disposed in the sacrificial pad regions 118P may be formed to have a length relatively less than that of the other fourth tunnel portions TL4.

In this process, openings of the third and fourth tunnels TL3 and TL4 may be decreased by the other sacrificial layer 122 or byproducts of the etching process. Accordingly, the semiconductor device 100*d* having the insulating structure 160 in FIG. 7 may be provided.

Referring to FIG. 10G, the first material layer 160*a* covering the openings OH, the third tunnel portions TL3, and the fourth tunnel portions TL4 may be formed. The first material layer 160*a* may be formed through a deposition process, such as, for example, an atomic layer deposition (ALD) process. The first material layer 160*a* may have a substantially uniform thickness and may conformally cover the third and fourth tunnel portions TL3 and TL4. The thickness of the first material layer 160*a* may be, for example, in a range of about 80 Å to about 100 Å. The first material layer 160*a* may include, for example, an insulating material such as oxide or silicon oxide.

Referring to FIG. 10H, a second material layer 160*b* covering the first material layer 160*a* may be formed. The second material layer 160*b* may be formed through a deposition process, such as, for example, an atomic layer deposition (ALD) process. The second material layer 160*b* may have a substantially uniform thickness and may be formed on the first material layer 160*a*.

In various example embodiments, the first and second material layers 160*a* and 160*b* may fill only a portion of the third tunnel portions TL3 while filling an entirety of the fourth tunnel portions TL4, but various example embodiments thereof is not limited thereto. For example, an empty space formed when the first and second material layers 160*a* and 160*b* does not completely fill the fourth tunnel portions TL4 may remain as a seam S (see FIG. 3A) through a subsequent process.

The thickness of the second material layer 160*b* may be, for example, in the range of about 20 Å to about 50 Å. The second material layer 160*b* may include a material different from that of the first material layer 160*a*. The second material layer 160*b* may include, for example, an insulating material such as silicon oxynitride.

Referring to FIG. 10I, a third material layer 160*c* may be formed in the openings OH, the third tunnel portions TL3, and the fourth tunnel portions TL4. The third material layer 160*c* may be formed by performing an oxidation process on at least a portion of the second material layer 160*b*.

In various example embodiments, the third material layer 160*c* may include the same material as that of the first material layer 160*a* by the oxidation process. Accordingly, a boundary surface between the first material layer 160*a* and the third material layer 160*c* may not be distinct. The third material layer 160*c* may extend into a region corresponding to the fourth tunnel portions TL4 according to process conditions of the oxidation process, but various example embodiments thereof is not limited thereto. Various insulating structures of the semiconductor device 100 in FIG. 3A, the semiconductor device 100*a* in FIG. 4, the semiconductor device 100*b* in FIG. 5, and the semiconductor device 100*c* in FIG. 6 may be formed depending on the process conditions of the oxidation process formed in this process or the thickness of the third material layer 160*c*.

At least a portion of the first material layer 160*a* may form a first portion P1 (see FIG. 3A) of the second insulating layer 162 (see FIG. 3A) formed through a subsequent process, and at least a portion of the third material layer 160*c* may form a second portion P2 (see FIG. 3A) of the second insulating layer 162 formed through a subsequent process.

In various example embodiments, the processes described with reference to FIGS. 10G to 10I may be performed in-situ in a process chamber, but various example embodiments thereof is not limited thereto.

Referring to FIG. 10J, the fifth tunnel portions TL5 may be formed by forming vertical sacrificial layers 191 and removing the sacrificial insulating layers 118.

The vertical sacrificial layers 191 filling the openings OH may be formed. The vertical sacrificial layers 191 may cover the preliminary insulating structure 160P including the first to third material layers 160*a*, 160*b*, and 160*c*. The vertical sacrificial layers 191 may be formed to fill the other space in the openings OH. The vertical sacrificial layers 191 may include a material different from that of the preliminary contact plug insulating layers 160P, such as, for example, polysilicon.

Thereafter, openings penetrating through the sacrificial insulating layers 118 and the interlayer insulating layers 120 and extending to the second substrate 101 may be formed in positions of the first and second isolation regions MS1 and MS2 (see FIG. 1).

Thereafter, the horizontal insulating layer 110 may be selectively removed from the first region R1 by performing an etch-back process while forming separate sacrificial spacer layers in the openings, and a portion of the exposed gate dielectric layer 145 may also be removed. After the first horizontal conductive layer 102 may be formed by depositing a conductive material in the region from which the horizontal insulating layer 110 is removed, and the sacrificial spacer layers may be removed from the openings. Through this process, the first horizontal conductive layer 102 may be formed in the first region R1.

Thereafter, the sacrificial insulating layers 118 may be selectively removed with respect to the interlayer insulating layers 120, the second horizontal conductive layer 104, and the substrate insulating layer 121 using, for example, wet etching. Accordingly, fifth tunnel portions TL5 may be formed between the interlayer insulating layers 120.

Referring to FIG. 10K, the gate electrodes 130 may be formed by filling the fifth tunnel portions TL5 with a conductive material, and the insulating structure 160 may be formed by removing a portion of the vertical sacrificial layers 191 and the preliminary insulating structure 160P filling the openings OH and the third tunnel portions TL3.

The conductive material forming the gate electrodes 130 may fill the fifth tunnel portions TL5. The conductive material may include a metal, polysilicon, or metal silicide material. After the gate electrodes 130 are formed, an isolation insulating layer 105 (see FIG. 2B) may be formed in the openings formed in the first and second isolation regions MS1 and MS2.

Thereafter, the vertical sacrificial layers 191 in the openings OH may be selectively removed. After the vertical sacrificial layers 191 are removed, the exposed preliminary insulating structure 160P may be partially removed through an etching process, such as, for example, a wet etching process. In this case, an entirety of the preliminary insulating structure 160P may be removed from the pad regions 130P such that the first gate electrode 130*a* may be exposed, and the preliminary insulating structure 160P may remain there below and may form the insulating structure 160. Accordingly, the second gate electrode 130*b* disposed below the first gate electrode 130*a* may not be exposed from the openings OH by the insulating structure 160.

The insulating structure 160 may include a first insulating layer 161 which may be a portion of the second material layer 160*b* and a second insulating layer 162 which may be a portion of the first and third material layers 160*a* and 160*c*. The second insulating layer 162 may surround the first insulating layer 161 in a form in which the first portion P1 which is the first material layer 160*a* is connected to the second portion P2 which is the third material layer 160*c*.

In this process, a boundary surface between the second portion P2 of the second insulating layer 162 and the first insulating layer 161 may prevent or reduce the insulating structure 160 from being removed during the etching process. Accordingly, the second gate electrode 130*b* and the openings OH may be isolated from each other by the insulating structure 160.

Figure 10L:
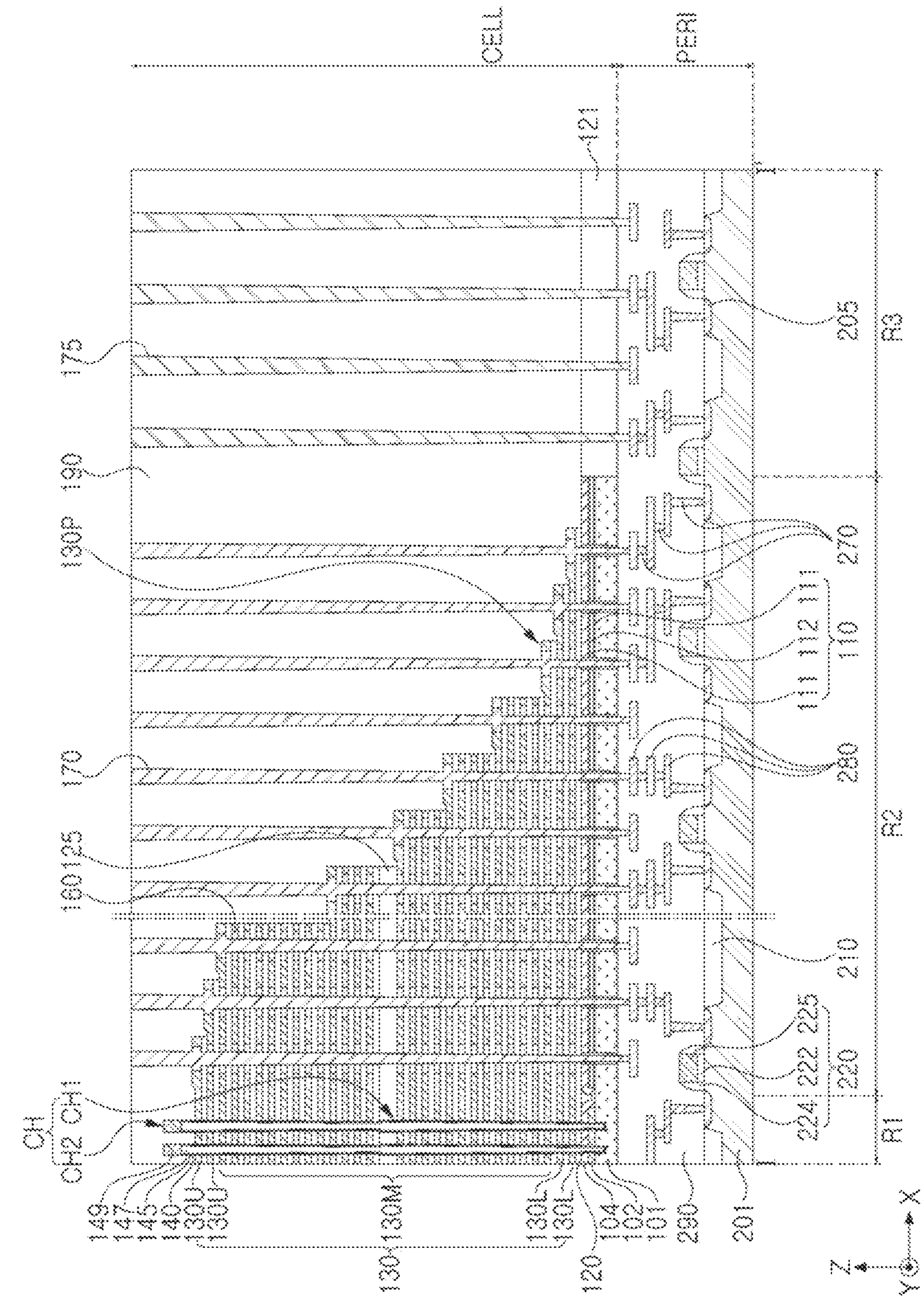

Referring to FIG. 10L, a conductive material may be deposited in the openings OH and may form gate contact plugs 170 and through contact plugs 175.

The circuit wiring lines 280 may be exposed by removing the pad layers 285 (see FIG. 3B) from lower ends of the openings OH, and the conductive material may be deposited therein. Since the gate contact plugs 170 and the through contact plugs 175 may be formed together in the same process, the gate contact plugs 170 and the through contact plugs 175 may have the same structure. The gate contact plugs 170 may be formed to have a horizontal extension portion 170H (see FIG. 3A) in the pad regions 130P, and may thus be physically and electrically connected to the gate electrodes 130.

Thereafter, referring back to FIG. 2A, by forming cell wiring lines 195 connected to upper ends of the gate contact plugs 170 and the through contact plugs 175, the semiconductor device 100 may be manufactured.

Figure 11:
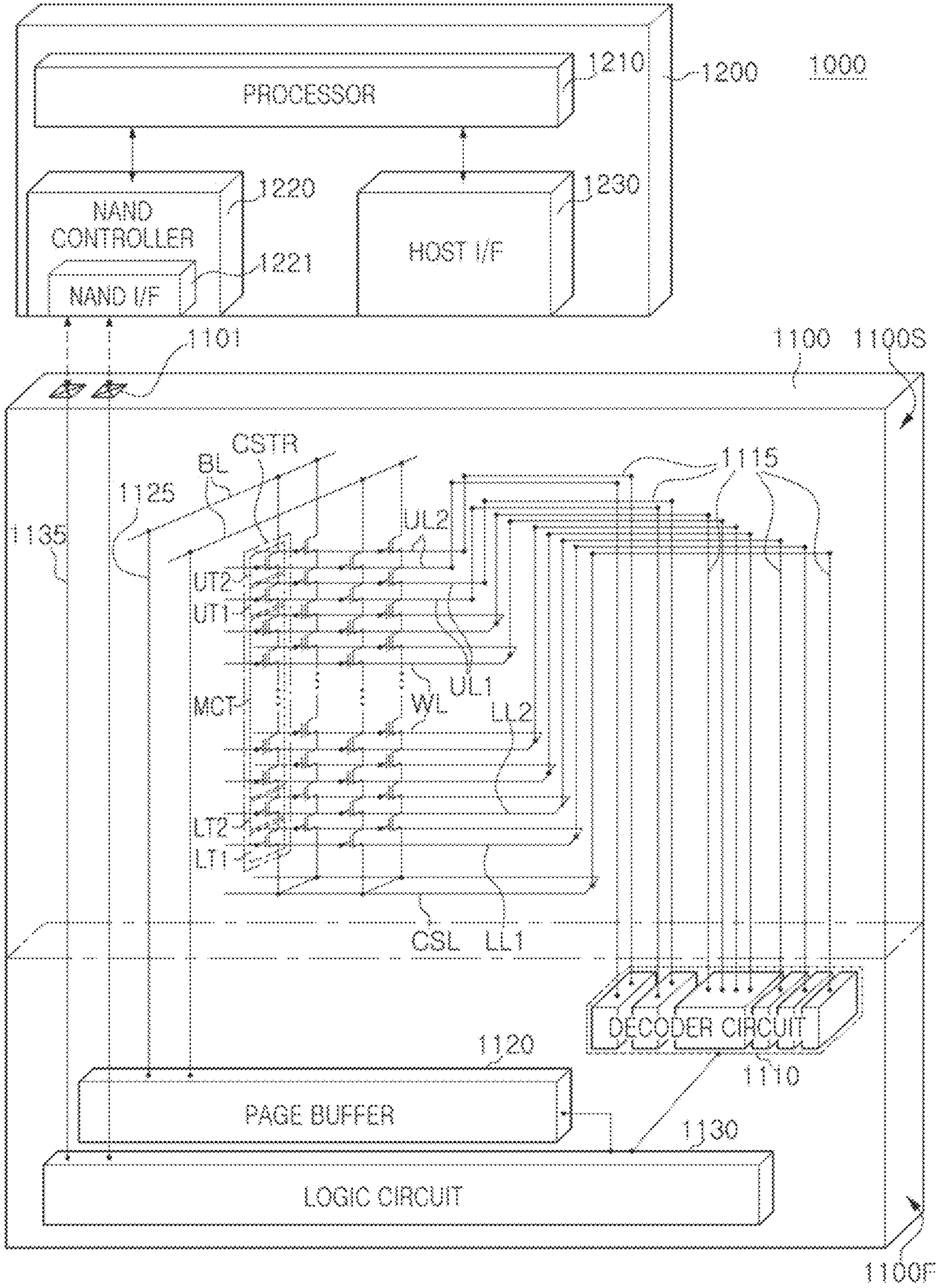
FIG. 11 is a diagram illustrating a data storage system including a semiconductor device according to various example embodiments.

FIG. 11 is a diagram illustrating a data storage system including a semiconductor device according to various example embodiments.

Referring to FIG. 11, the data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described above with reference to FIGS. 1 to 9. The semiconductor device 1100 may include a first structure 1100F and a second structure 1100S on the first structure 1100F. In some example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in some example embodiments.

In some example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection wires 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

Figure 12:
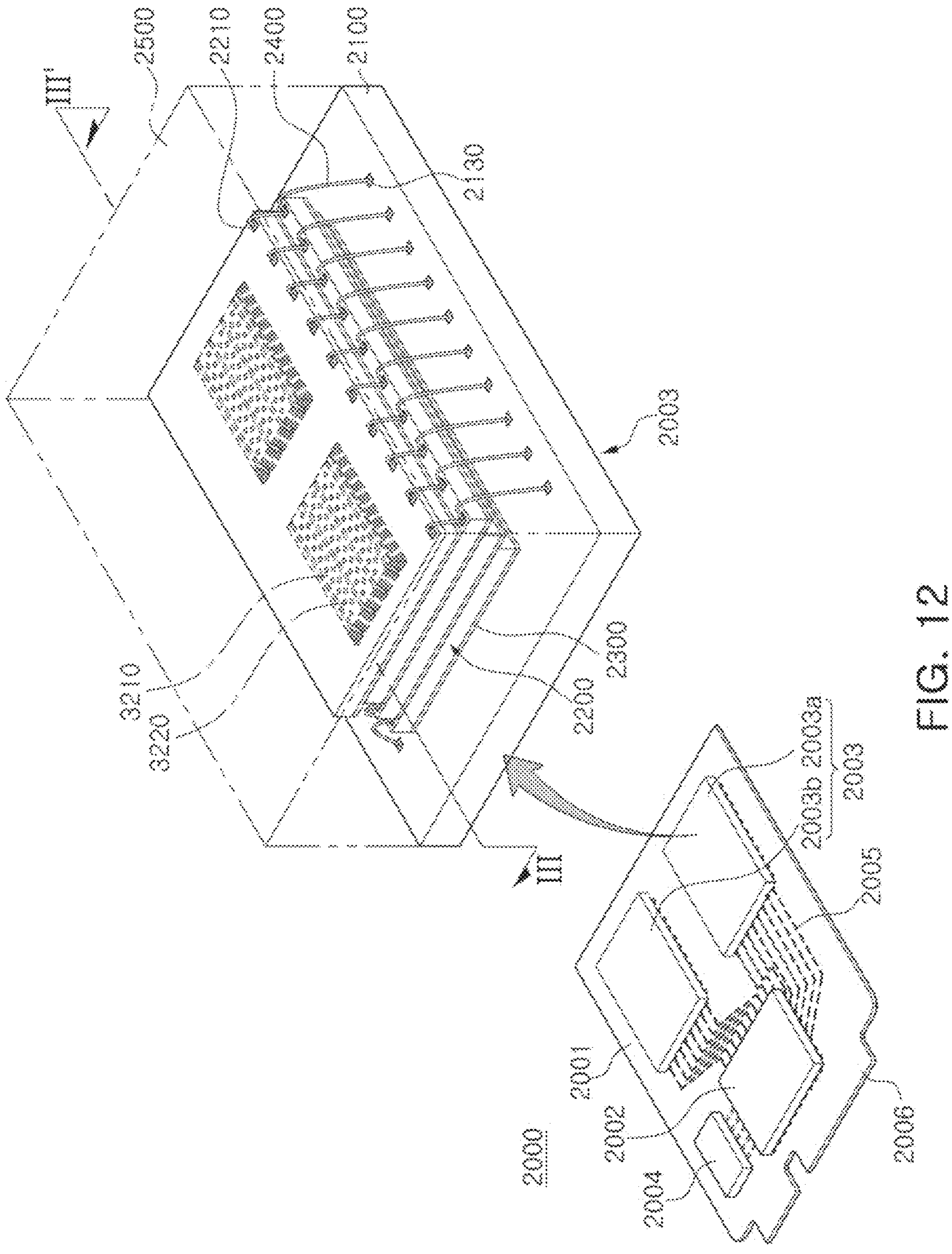
FIG. 12 is a perspective diagram illustrating a data storage system including a semiconductor device according to various example embodiments.

FIG. 12 is a perspective diagram illustrating a data storage system including a semiconductor device according to various example embodiments.

Referring to FIG. 12, a data storage system 2000 in various example embodiments may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In some example embodiments, the data storage system 2000 may communicate with an external host according to one or more of interfaces from among universal serial bus (USB), peripheral component interconnect express (PCI-Express), serial advanced technology attachment (SATA), M-Phy for universal flash storage (UFS). In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be configured as a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 12. Each of the semiconductor chips 2200 may include gate stack structures 3210 and channel structures 3220. Each of the semiconductor chips 2200 may include one or more various semiconductor devices described above with reference to FIGS. 1 to 9.

In some example embodiments, the connection structure 2400 may be configured as a bonding wire electrically connecting the input/output pad 2210 to the upper package pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. In some example embodiments, in each of the first and second semiconductor packages 2003*a* and 2003*b*, the semiconductor chips 2200 may be electrically connected to each other by a connection structure including a through-electrode (TSV) instead of the connection structure 2400 of a bonding wire method.

In some example embodiments, the controller 2002 and the semiconductor chips 2200 may be included in a single package. In various example embodiments, the controller 2002 and the semiconductor chips 2200 may be mounted on a separate interposer substrate different from the main substrate 2001, and the controller 2002 and the semiconductor chips 2200 may be connected to each other wiring formed on the interposer substrate.

Figure 13:
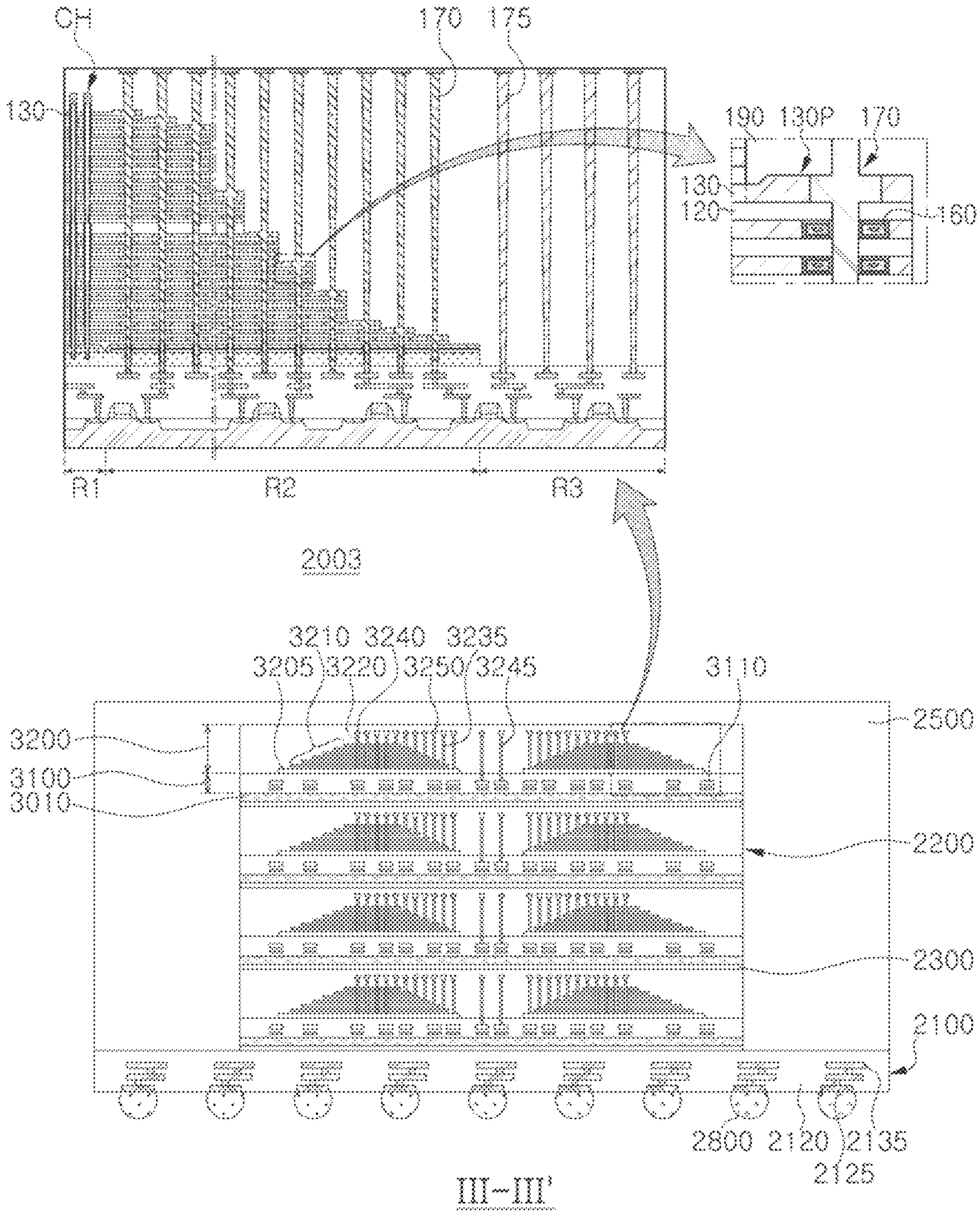
FIG. 13 is a cross-sectional diagram illustrating a semiconductor package according to various example embodiments.

FIG. 13 is a cross-sectional diagram illustrating a semiconductor package according to various example embodiments, illustrating various example embodiments of the semiconductor package 2003 in FIG. 12 taken along line III-III' in FIG. 13.

Referring to FIG. 13, in the semiconductor package 2003, the package substrate 2100 may be implemented as a printed circuit board. The package substrate 2100 may include a package substrate body 2120, package upper pads 2130 (see FIG. 12) disposed on the upper surface of the package substrate body 2120, lower pads 2125 disposed on the lower surface of the package substrate body 2120 or exposed through the lower surface, and internal wirings 2135 electrically connecting the upper pads 2130 to the lower pads 2125 in the package substrate body 2120. The upper pads 2130 may be electrically connected to the connection structures 2400. The lower pads 2125 may be connected to the wiring patterns 2005 of the main board 2010 of the data storage system 2000 as illustrated in FIG. 17 through conductive connection portions 2800.

Each of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 penetrating through the gate stack structure 3210 and isolation regions 3230, bit lines 3240 electrically connected to the memory channel structures 3220, and gate contact plugs 3235 electrically connected to the word lines WL (see FIG. 11) of the gate stack structure 3210. As described above with reference to FIGS. 1 to 9, in each of the semiconductor chips 2200, the isolation structures MS may include the first insulating layer 161 and the second insulating layer 162 surrounding at least a portion of the first insulating layer 161.

Each of the semiconductor chips 2200 may include a through wire 3245 electrically connected to the peripheral wires 3110 of the first structure 3100 and extending into the second structure 3200. The through wiring 3245 may be disposed externally of the gate stack structure 3210, and may be further disposed to penetrate through the gate stack structure 3210. Each of the semiconductor chips 2200 may further include an input/output pad 2210 electrically connected to the peripheral wirings 3110 of the first structure 3100.

According to various example embodiments, by including a contact plug structure spaced apart from a portion of the gate electrodes by insulating structures having a double layer structure, a semiconductor device having improved production yield an\d/or electrical properties and a data storage system including the same may be provided.

Alternatively or additionally, a semiconductor device with improved production yield and/or electrical properties by including a contact plug structure spaced apart from a portion of the gate electrodes by insulating structures having a double layer structure, and a data storage system including the same may be provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Example embodiments described above are not necessarily mutually exclusive with one another. For example, some example embodiments may include one or more features described with reference to one or more figures, and may also include one or more features described with reference to one or more other figures.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments have been illustrated and described above, it will be considered as apparent to those of ordinary skill in the art that modifications and/or variations could be made without departing from the scope of inventive concepts as defined by the appended claims. Furthermore the variously described example embodiments are not necessarily mutually exclusive with one another. For example, some example embodiments may include one or more features described with reference to one or more figures, and may also include one or more features described with reference to one or more other figures.

What is claimed is:

1. A semiconductor device, comprising:

a first semiconductor structure including a first substrate and circuit devices on the first substrate; and a second semiconductor structure on the first semiconductor structure, wherein the second semiconductor structure includes:

a second substrate having a first region and a second region;

gate electrodes spaced apart from each other on the first region in a first direction, extending on the second region by different lengths in a second direction, and respectively including a pad region on the second region having an upper surface exposed upwardly;

interlayer insulating layers alternately stacked with the gate electrodes;

channel structures penetrating through the gate electrodes, extending in the first direction, and respectively including a channel layer;

gate contact plugs penetrating through the pad region of each of the gate electrodes and extending into the first semiconductor structure in the first direction, the gate contact plugs having a vertical extension portion extending in a vertical direction perpendicular to a surface of the first substrate and including a horizontal extension portion connected to the vertical extension portion and surrounding the vertical extension portion, the gate contact plugs including a conductive material, a bottom surface of the horizontal extension portion on a respective uppermost interlayer insulating layer from among the interlayer insulating layers; and an insulating structure alternating between the interlayer insulating layers below a respective one of the pad region, surrounding the gate contact plugs, and having a first sidewall abutting a second sidewall of the gate electrodes, wherein the insulating structure further includes a first insulating layer and a second insulating layer surrounding all of the first insulating layer and including a material different from any material of the first insulating layer, and the second insulating layer includes a first portion filling a region between the first insulating layer and each of the gate electrodes opposing the first insulating layer and extending onto upper and lower surfaces of the first insulating layer.

2. The semiconductor device of claim 1, wherein the first portion of the second insulating layer has a uniform thickness.

3. The semiconductor device of claim 1, wherein the second insulating layer further includes a second portion between the first insulating layer and the gate contact plugs, and the first portion and the second portion are integrally connected to each other.

4. The semiconductor device of claim 3, wherein a first thickness of the first portion is different from a second thickness of the second portion.

5. The semiconductor device of claim 3, wherein the second insulating layer has a protrusion extending in a direction from the second portion toward an internal region of the first insulating layer.

6. The semiconductor device of claim 1, wherein a first thickness of the first portion ranges from about 80 A to about 100 A.

7. The semiconductor device of claim 1, wherein the first insulating layer defines a seam within the first insulating layer.

8. The semiconductor device of claim 1, wherein the first insulating layer includes oxide, and the second insulating layer includes silicon oxynitride.

9. The semiconductor device of claim 1, wherein each of the gate electrodes has a first gate thickness in a stack region other than the pad region, and has a second gate thickness greater than the first gate thickness in the pad region.

10. The semiconductor device of claim 1, wherein the first semiconductor structure further includes pad layers in contact with the gate contact plugs on lower ends of the gate contact plugs.

11. The semiconductor device of claim 1, wherein the second semiconductor structure includes:

substrate insulating layers penetrating through the second substrate and surrounding the gate contact plugs, respectively;

a horizontal insulating layer horizontally below the gate electrodes on a portion of the second substrate; and a horizontal conductive layer on the horizontal insulating layer, wherein the gate contact plugs penetrate the horizontal insulating layer and the horizontal conductive layer, and are spaced apart from the horizontal insulating layer and the horizontal conductive layer by the substrate insulating layers.

12. The semiconductor device of claim 1, wherein a distance of one side surface of the insulating structure opposing each of the gate electrodes in the first direction is greater than a distance of another side surface opposing the gate contact plugs in the first direction.

13. A semiconductor device, comprising:

a substrate having a first region and a second region;

gate electrodes stacked and spaced apart from each other in a first direction on the first region, extending on the second region by different lengths in a second direction, and respectively including a pad region on the second region having an upper surface exposed upwardly and a remaining stack region;

interlayer insulating layers alternately stacked with the gate electrodes a gate contact plug penetrating through the pad region of a first gate electrode, which is one of the gate electrodes, electrically connected to the first gate electrode, penetrating through the remaining stack region of a second gate electrode, which is another one of the gate electrodes and below the first gate electrode, the gate contact plug spaced apart from the second gate electrode, the gate contact plug having a vertical extension portion extending in a vertical direction perpendicular to a surface of the substrate and including a horizontal extension portion connected to the vertical extension portion and surrounding the vertical extension portion, the gate contact plug including a conductive material; and an insulating structure between the gate contact plug and the second gate electrode, and having a first sidewall abutting a second sidewall of the second gate electrode, wherein side surfaces of the horizontal extension portion in the second direction are in contact with a respective pad region of the gate electrodes, wherein side surfaces of the vertical extension portion in the second direction are spaced apart from the gate electrodes by the insulating structure, wherein the insulating structure includes a first insulating layer and a second insulating layer including a material different from any material of the first insulating layer and fully surrounding the first insulating layer.

14. The semiconductor device of claim 13, wherein the first insulating layer is spaced apart from the gate contact plug and the second gate electrode.

15. The semiconductor device of claim 13, wherein the second insulating layer includes a first portion extending with a first thickness and a second portion extending with a second thickness different from the first thickness, the first portion and the second portion are integrally connected to each other, and the second portion is in contact with the gate contact plug.

16. The semiconductor device of claim 13, wherein the insulating structure has a thickness decreasing from the second gate electrode toward the gate contact plug.

17. The semiconductor device of claim 7, wherein the seam is an air seam.

18. The semiconductor device of claim 1, wherein the vertical extension portion penetrates the second substrate.

* * * * *